US011257841B2

(12) United States Patent
Kang et al.

(10) Patent No.: US 11,257,841 B2
(45) Date of Patent: Feb. 22, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Jin-Kyu Kang, Suwon-si (KR);
Woojae Jang, Suwon-si (KR);
Changsub Lee, Suwon-si (KR); Sejun Park, Suwon-si (KR); Jaeduk Lee, Suwon-si (KR); Jung Hoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/787,195

(22) Filed: Feb. 11, 2020

(65) Prior Publication Data
US 2020/0328227 A1 Oct. 15, 2020

(30) Foreign Application Priority Data

Apr. 10, 2019 (KR) .......................... 10-2019-0042159

(51) Int. Cl.
| H01L 27/11582 | (2017.01) |
| H01L 29/792 | (2006.01) |
| H01L 29/423 | (2006.01) |
| H01L 29/78 | (2006.01) |

(52) U.S. Cl.
CPC .. *H01L 27/11582* (2013.01); *H01L 29/42364* (2013.01); *H01L 29/7926* (2013.01); *H01L 29/7827* (2013.01)

(58) Field of Classification Search
None
See application file for complete search history.

(56) References Cited

U.S. PATENT DOCUMENTS

| 8,017,993 | B2 | 9/2011 | Kidoh et al. |
| 8,723,247 | B2 | 5/2014 | Komori et al. |
| 9,041,090 | B2 | 5/2015 | Simsek-Ege et al. |
| 9,281,414 | B2 | 3/2016 | Won et al. |
| 9,576,977 | B2 | 2/2017 | Yoo |
| 9,613,979 | B2 | 4/2017 | Linuma |
| 9,653,565 | B2 | 5/2017 | Jang et al. |
| 9,553,146 | B2 | 6/2017 | Zhang et al. |

(Continued)

*Primary Examiner* — Hsien Ming Lee
(74) *Attorney, Agent, or Firm* — Volentine, Whitt & Francos, PLLC

(57) ABSTRACT

A three-dimensional semiconductor memory device including a stack structure including gate structures and first dielectric patterns alternately stacked, a vertical channel penetrating the stack structure, and a charge storage layer extending from between the vertical channel and the first gate structures to between the vertical channel and the first dielectric patterns. The gate structures include first gate structures having a top surface and a bottom surface facing each other and having different width. The charge storage layer includes first segments between the vertical channel and the first gate structures, and second segments between the vertical channel and the first dielectric patterns. A thickness of the first segments is greater than a thickness of the second segments. One of the width of the top surface and the width of bottom surface of each first gate structure is the same as that of a first dielectric pattern on the first gate structure.

18 Claims, 35 Drawing Sheets

(56) References Cited

U.S. PATENT DOCUMENTS

| | | |
|---|---|---|
| 9,691,783 B2 | 6/2017 | Yoon |
| 9,728,546 B2 | 8/2017 | Serov et al. |
| 9,960,180 B1 | 5/2018 | Zhou et al. |
| 9,991,277 B1 | 6/2018 | Tsutsumi et al. |
| 10,032,935 B2 | 7/2018 | Higuchi et al. |
| 2013/0032874 A1 | 2/2013 | Ko |
| 2017/0062471 A1 | 3/2017 | Son |
| 2018/0240810 A1 | 8/2018 | Tsuda |
| 2018/0331117 A1* | 11/2018 | Titus ................ H01L 27/11565 |

\* cited by examiner

THREE-DIMENSIONAL SEMICONDUCTOR MEMORY DEVICE

CROSS-REFERENCE TO RELATED APPLICATION

A claim for priority under 35 U.S.C § 119 is made to Korean Patent Application No. 10-2019-0042159 filed on Apr. 10, 2019 in the Korean Intellectual Property Office, the entire contents of which are hereby incorporated by reference.

BACKGROUND

The present inventive concepts relate to semiconductor memory devices, and more particularly, to three-dimensional semiconductor memory devices.

Semiconductor devices have recently become highly integrated to satisfy the demand for high performance and low cost devices. Since the integration of semiconductor devices is an important factor in determining product price, highly integrated semiconductor devices are increasingly demanded. Integration of typical two-dimensional or planar semiconductor devices is primarily determined by the area occupied by a unit memory cell, and is greatly influenced by the level of technology for forming fine patterns. However, the extremely expensive processing equipment needed to increase pattern fineness may set a practical limitation on increasing integration of two-dimensional or planar semiconductor devices. As a result, there has been increased interest in three-dimensional semiconductor memory devices having three-dimensionally arranged memory cells.

SUMMARY

Embodiments of the inventive concepts provide a three-dimensional semiconductor memory device with improved electrical characteristics.

Embodiments of the inventive concepts provide a three-dimensional semiconductor memory device including a stack structure including a plurality of gate structures and first dielectric patterns alternately and repeatedly stacked on a substrate, the gate structures including a plurality of first gate structures each having a top surface and a bottom surface that faces the top surface, and a width of the top surface is different than a width of the bottom surface; a vertical channel penetrating the stack structure on the substrate; and a charge storage layer extending from between the vertical channel and the first gate structures to between the vertical channel and the first dielectric patterns. The charge storage layer including first segments between the vertical channel and the first gate structures, and second segments between the vertical channel and the first dielectric patterns. A thickness of the first segments is greater than a thickness of the second segments. One of the width of the top surface and the width of the bottom surface of each first gate structure from among the first gate structures is the same as a width of a first dielectric pattern from among the first dielectric patterns on the first gate structure.

Embodiments of the inventive concepts further provide a three-dimensional semiconductor memory device including a stack structure including a plurality of gate structures and first dielectric patterns alternately and repeatedly stacked on a substrate, the gate structures including a plurality of first gate structures each having a top surface and a bottom surface that faces the top surface, and a width of the top surface is different than a width of the bottom surface; a vertical channel penetrating the stack structure on the substrate; and a charge storage structure extending from between the vertical channel and the first gate structures to between the vertical channel and the first dielectric patterns, the charge storage structure including first charge storage segments between the vertical channel and the first gate structures, and second charge storage segments between the vertical channel and the first dielectric patterns. A thickness of the first charge storage segment is greater than a thickness of the second charge storage segment. One of the width of the top surface and the width of the bottom surface of each first gate structure from among the first gate structures is the same as a width of a first dielectric pattern from among the first dielectric patterns on the first gate structure.

Embodiments of the inventive concepts still further provide a three-dimensional semiconductor memory device including a stack structure including a plurality of gate structures and a dielectric patterns alternately and repeatedly stacked on a substrate, the gate structures including a plurality of first gate structures each having a top surface and a bottom surface that faces the top surface, and a width of the top surface is different than a width of the bottom surface, the dielectric patterns including first dielectric patterns adjacent to the first gate structures; and a vertical channel structure penetrating the stack structure, the vertical channel structure extending onto first sidewalls of the first gate structures and onto first sidewalls of the first dielectric patterns. The vertical channel structure has protrusions which protrude from a sidewall of the vertical channel structure. The first sidewalls of each of the first gate structures include first recess regions. The protrusions are in the first recess regions. One of the width of the top surface and the width of the bottom surface of each first gate structure from among the first gate structures is the same as a width of a first dielectric pattern from among the first dielectric patterns on the first gate structure.

Embodiments of the inventive concepts also provide a semiconductor memory device including a stack structure including gate structures and dielectric structures alternately and repeatedly stacked; a vertical channel penetrating the stack structure; and a charge storage structure disposed between the vertical channel and the gate structures, and between the vertical channel and the dielectric layers. The charge storage structure includes protrusions that extend into recess regions disposed in sidewalls of the gate structures at interfaces between the gate structures and the dielectric structure.

BRIEF DESCRIPTION OF THE DRAWINGS

Features of the inventive concepts will become apparent in view of the following detailed description made with reference to the accompanying drawings.

DETAILED DESCRIPTION OF EMBODIMENTS

Hereinafter, embodiments of the inventive concepts will be described in detail and clearly to such an extent that those of ordinary skill in the art may easily implement the inventive concepts.

Figure 1:
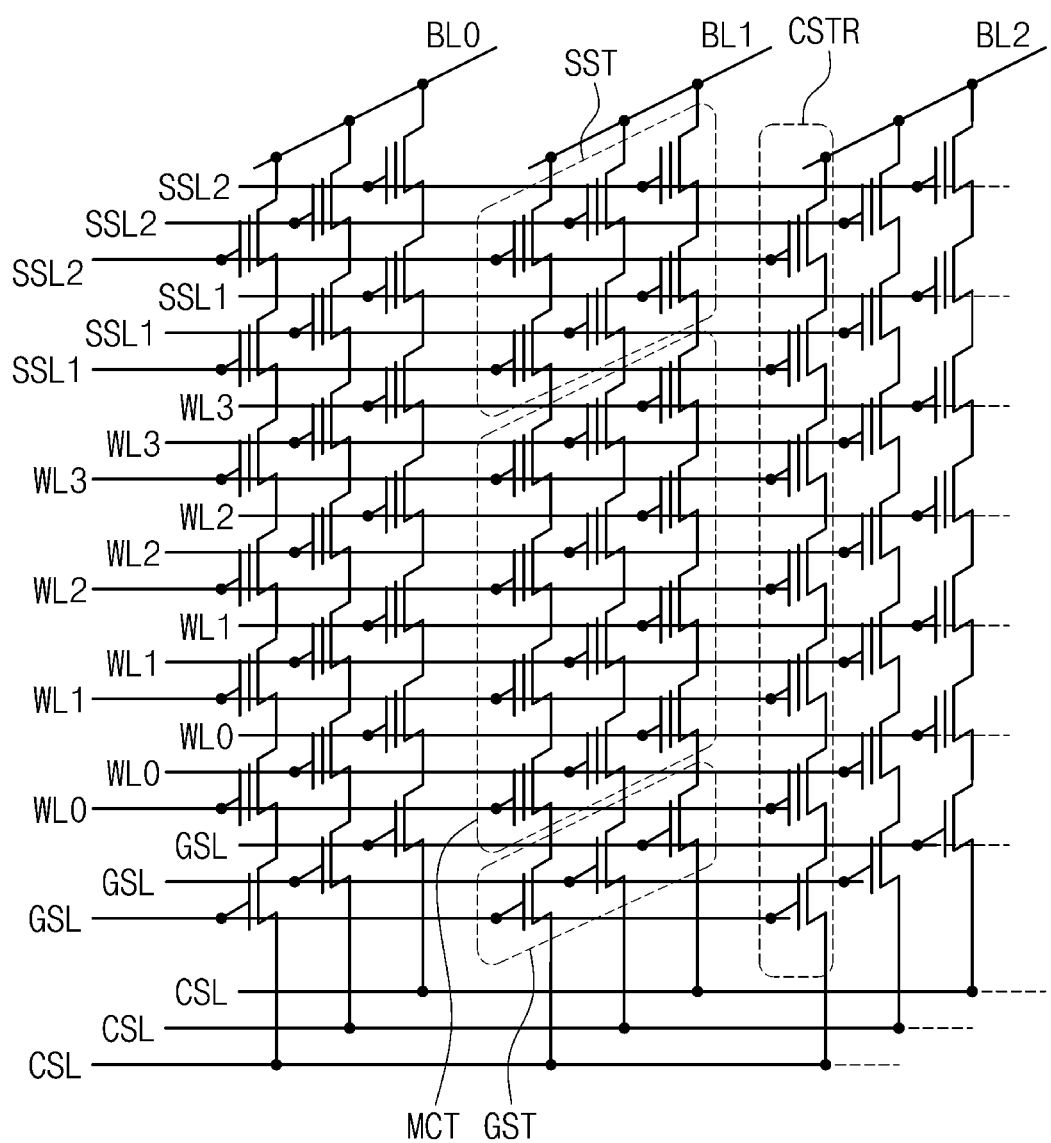
FIG. 1 illustrates a simplified circuit diagram showing a cell array of a three-dimensional semiconductor memory device according to some example embodiments of the inventive concepts.

FIG. 1 illustrates a simplified circuit diagram showing a cell array of a three-dimensional semiconductor memory device according to some example embodiments of the inventive concepts.

Referring to FIG. 1, a three-dimensional semiconductor memory device may include a common source line CSL, a plurality of bit lines BL0 to BL2 (i.e., bit lines BL0, BL1 and BL2), and a plurality of cell strings CSTR between the common source line CSL and the bit lines BL0 to BL2.

The bit lines BL0 to BL2 may be two-dimensionally arranged, and a plurality of cell strings CSTR may be connected in parallel to each of the bit lines BL0 to BL2. The cell strings CSTR may thus be two-dimensionally arranged either on the common source line CSL or on a substrate.

Each of the cell strings CSTR may include a ground select transistor GST connected to the common source line CSL, a string select transistor SST connected to one of the bit lines BL0 to BL2, and a plurality of memory cell transistors MCT between the ground and string select transistors GST and SST. The ground select transistor GST, the string select transistor SST, and the memory cell transistors MCT may be connected in series. In addition, a ground select line GSL, a plurality of word lines WL0 to WL3 (i.e., WL0, WL1, WL2 and WL3), and a plurality of string select lines SSL1 and SSL2, which lines GSL, WL0 to WL3, SSL1, and SSL2 are disposed between the common source line CSL and the bit lines BL0 to BL2, may be used as gate electrodes of the ground select transistor GST, the memory cell transistors MCT, and the string select transistor SST, respectively.

Figure 2:
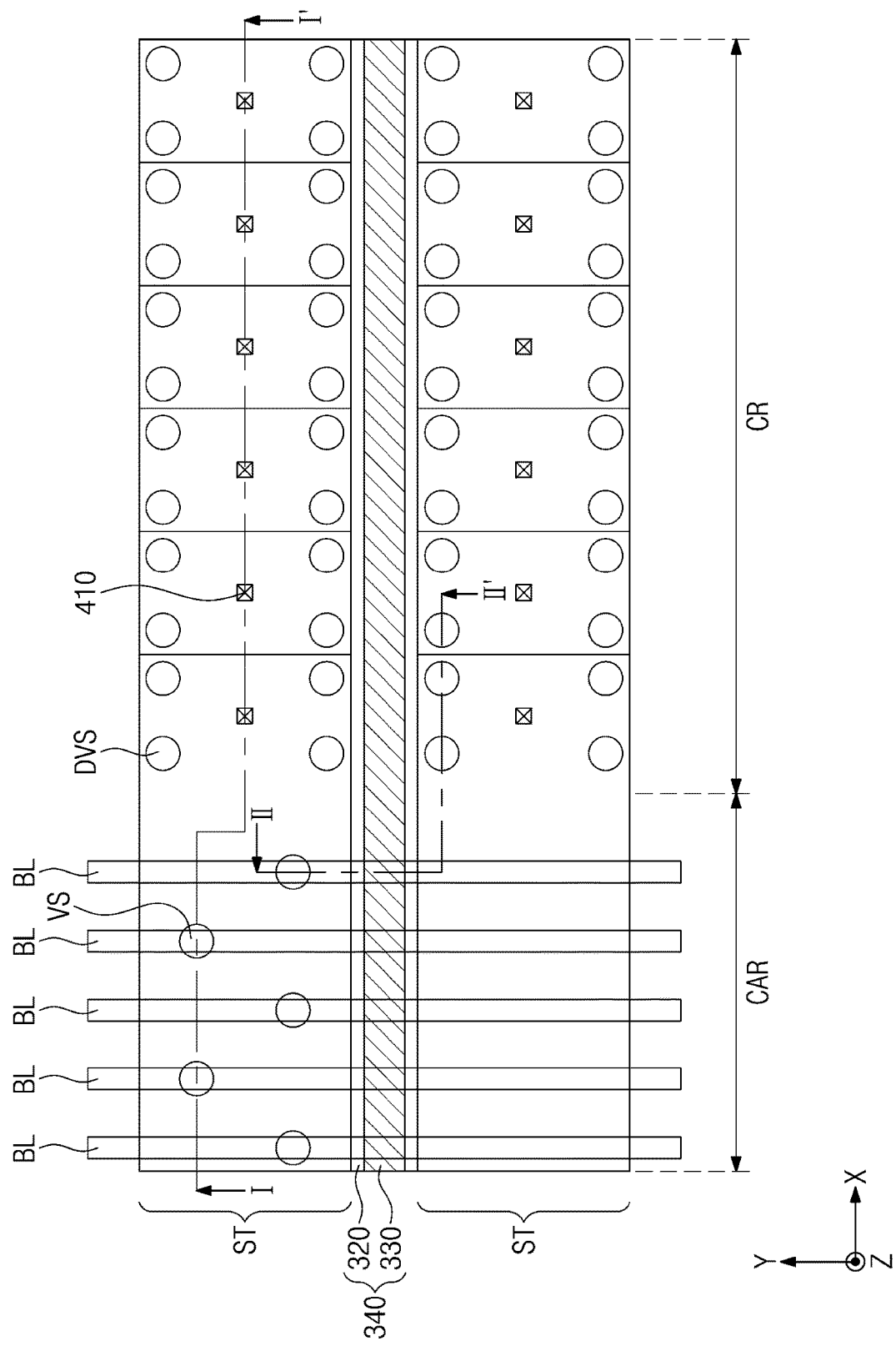
FIG. 2 illustrates a plan view showing a three-dimensional semiconductor memory device according to some example embodiments of the inventive concepts.
Figure 3:
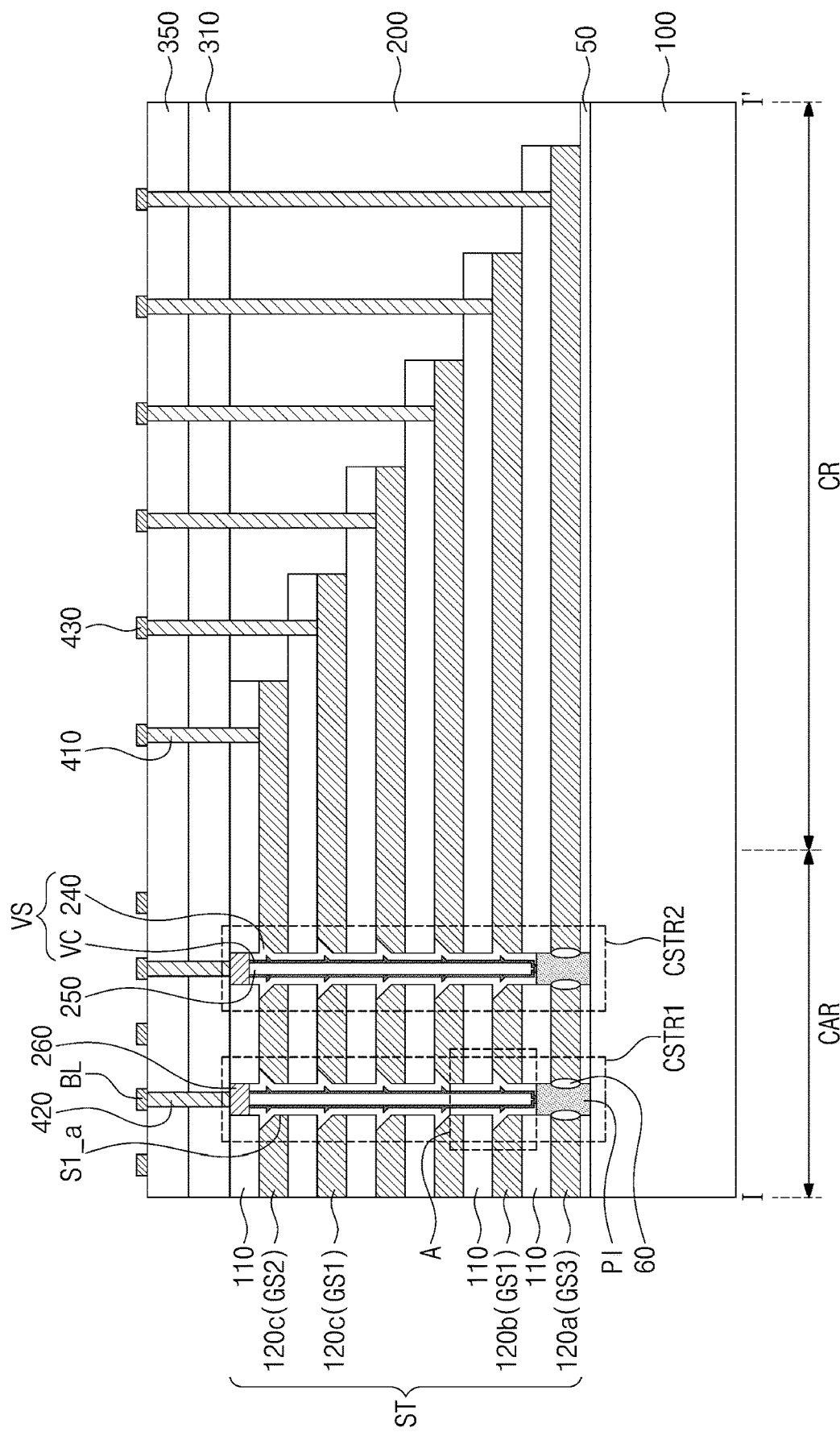
FIG. 3 illustrates a cross-sectional view taken along line I-I' of FIG. 2, showing a three-dimensional semiconductor memory device according to some example embodiments of the inventive concepts.
Figure 4:
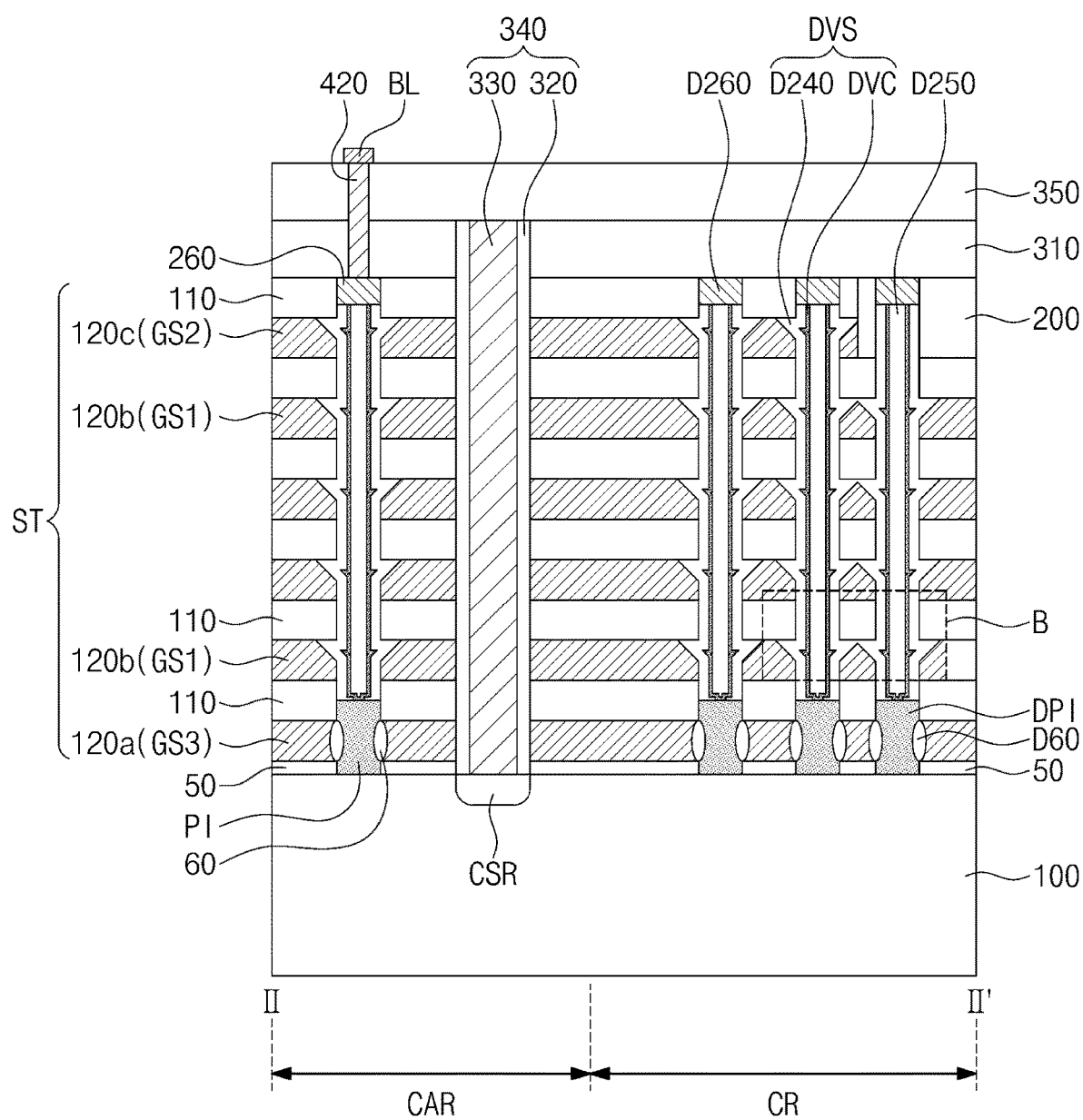
FIG. 4 illustrates a cross-sectional view taken along line II-II' of FIG. 2, showing a three-dimensional semiconductor memory device according to some example embodiments of the inventive concepts.
Figure 5:
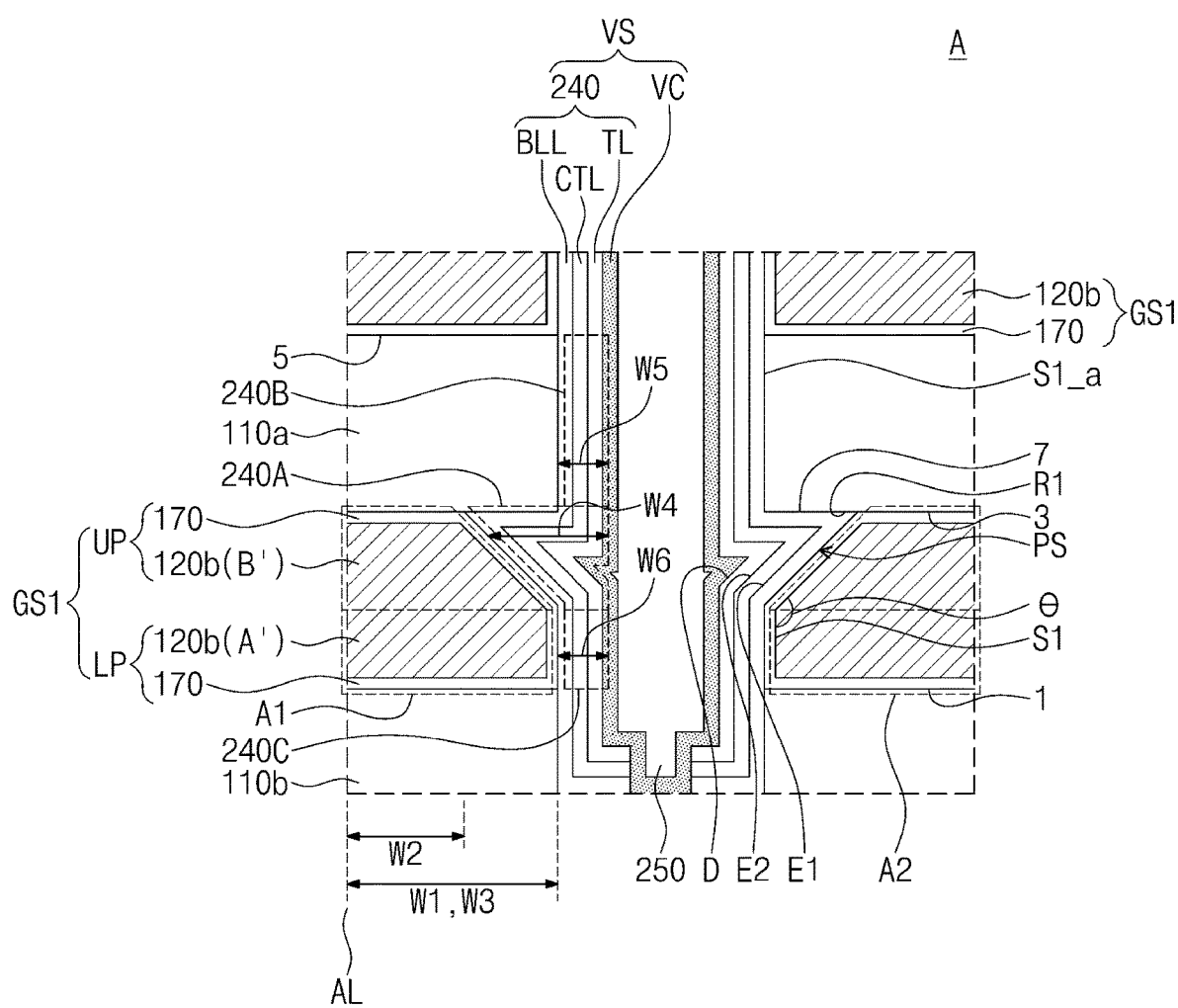
FIG. 5 illustrates an enlarged view of section A in FIG. 3, showing a three-dimensional semiconductor memory device according to some example embodiments of the inventive concepts.
Figure 6A:
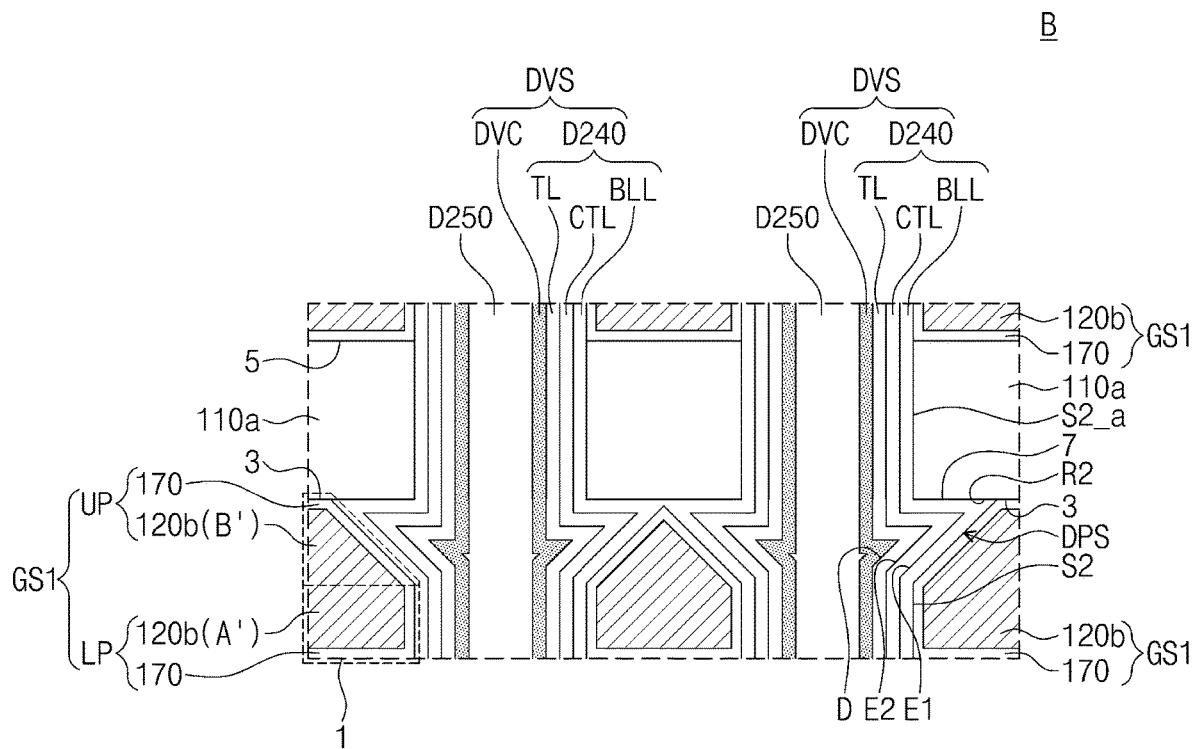
FIG. 6A illustrates an enlarged view of section B in FIG. 4, showing a three-dimensional semiconductor memory device according to some example embodiments of the inventive concepts.
Figure 6B:
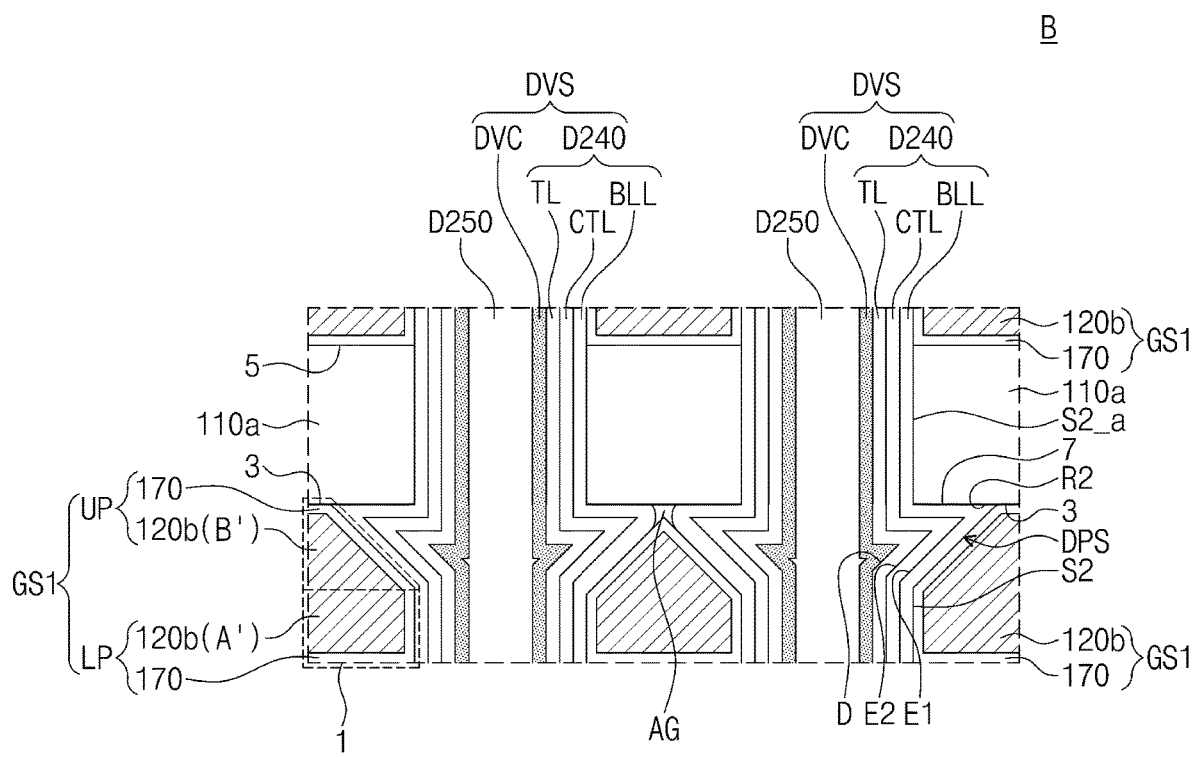
FIG. 6B illustrates an enlarged view of section B in FIG. 4, showing a three-dimensional semiconductor memory device according to some example embodiments of the inventive concepts
Figure 7:
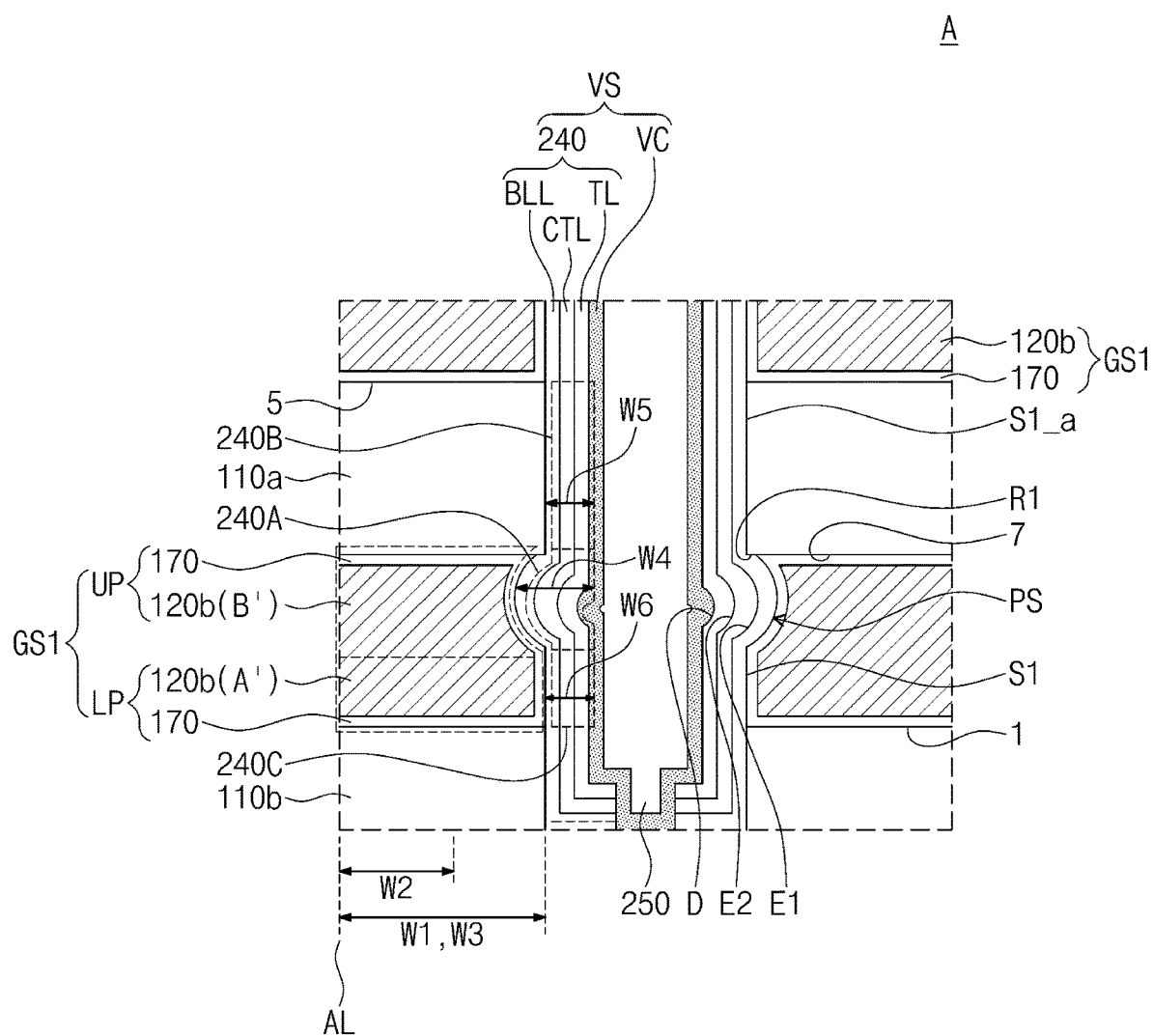
FIG. 7 illustrates an enlarged view of section A in FIG. 3, showing a three-dimensional semiconductor memory device according to some example embodiments of the inventive concepts.

FIG. 2 illustrates a plan view showing a three-dimensional semiconductor memory device according to some example embodiments of the inventive concepts. FIG. 3 illustrates a cross-sectional view taken along line I-I' of FIG. 2, showing a three-dimensional semiconductor memory device according to some example embodiments of the inventive concepts. FIG. 4 illustrates a cross-sectional view taken along line II-II' of FIG. 2, showing a three-dimensional semiconductor memory device according to some example embodiments of the inventive concepts. FIG. 5 illustrates an enlarged view of section A in FIG. 3, showing a three-dimensional semiconductor memory device according to some example embodiments of the inventive concepts. FIGS. 6A and 6B illustrate enlarged views of section B in FIG. 4, showing a three-dimensional semiconductor memory device according to some example embodiments of the inventive concepts. FIG. 7 illustrates an enlarged view of section A in FIG. 3, showing a three-dimensional semiconductor memory device according to some example embodiments of the present concepts.

Referring to FIGS. 2, 3, and 4, a substrate 100 may include a cell array region CAR and a pad region CR. The substrate 100 may be for example a silicon substrate, a silicon-germanium substrate, a germanium substrate, or a single crystalline epitaxial layer grown on a single crystalline silicon substrate. A buffer dielectric layer 50 may be disposed on (or over) a top surface of the substrate 100. The buffer dielectric layer 50 may be placed on the cell array region CAR and the pad region CR of the substrate 100. The buffer dielectric layer 50 may include, for example, a thermal oxide layer or a silicon oxide layer.

Stack structures ST may be disposed on the cell array region CAR and the pad region CR of the substrate 100. The stack structures ST may extend in a first direction X on the substrate 100, and may be spaced apart in a second direction Y intersecting the first direction X. A common source region CSR may be disposed in the substrate 100 between the stack structures ST. The common source region CSR may extend in the first direction X. The common source region CSR may have a conductive type different from that of the substrate 100.

Each of the stack structures ST may include dielectric patterns 110 and gate electrodes 120a, 120b, and 120c that are alternately and repeatedly stacked on the buffer dielectric layer 50. The dielectric patterns 110 may be stacked on the substrate 100 in a third direction Z perpendicular to the top surface of the substrate 100. The dielectric patterns 110 may include, for example, a silicon oxide layer. Each of the gate electrodes 120a, 120b, and 120c may be disposed between the dielectric patterns 110. That is, gate electrode 120b for example is disposed between a pair of the dielectric patterns 110. The gate electrodes 120a, 120b, and 120c may include a ground select gate electrode 120a, a string select gate electrode 120c, and cell gate electrodes 120b between the ground select gate electrode 120a and the string select gate electrode 120c. The ground select gate electrode 120a may be a lowermost one of the gate electrodes 120a, 120b, and 120c, and the string select gate electrode 120c may be an uppermost one of the gate electrodes 120a, 120b, and 120c. The ground select gate electrode 120a may be the ground select line GSL shown in FIG. 1, the cell gate electrodes 120b may be the word lines WL0 to WL3 illustrated in FIG. 1, and the string select gate electrode 120c may be the string select line SSL depicted in FIG. 1.

Each of the stack structures ST may have a stepwise structure on the pad region CR of the substrate 100. For example, the stack structure ST may have a height that decreases with increasing distance from the cell array region CAR. For example, each of the gate electrodes 120a, 120b, and 120c may have a length in the first direction X that decreases with increasing distance from the substrate 100. In certain embodiments, each of the gate electrodes 120a, 120b, and 120c may have a distal end on the pad region CR of the substrate 100. The distal ends of the ground select and cell gate electrodes 120a and 120b may be portions exposed by immediately overlying cell and string select gate electrodes 120b and 120c. The distal end of the string select gate electrode 120c may be a portion of the string select gate electrode 120c, which portion is disposed on the pad region CR.

Each of the dielectric patterns 110 may have a length in the first direction X that decreases with increasing distance from the substrate 100. The length in the first direction X of each of the dielectric patterns 110 may be substantially the same as the length in the first direction X of an immediately underlying one of the gate electrodes 120a, 120b, and 120c. Therefore, the distal ends of the gate electrodes 120a, 120b, and 120c may be covered with immediately overlying dielectric patterns 110.

An interlayer dielectric pattern 200 may be formed to cover the stepwise structure of the stack structure ST and the buffer dielectric layer 50. The interlayer dielectric pattern 200 may expose a top surface of the stack structure ST. The interlayer dielectric pattern 200 may include, for example, a tetraethylorthosilicate (TEOS) oxide layer.

Vertical channel structures VS may penetrate corresponding stack structures ST on the cell array region CAR of the substrate 100. The vertical channel structures VS may be arranged along the first direction X in a zigzag fashion or in a straight line. Semiconductor pillars PI may be disposed between the substrate 100 and the vertical channel structures VS. The semiconductor pillars PI may be disposed on the top surface of the substrate 100, and may penetrate the ground select gate electrode 120a. The semiconductor pillars PI may be electrically connected to the vertical channel structures VS. The semiconductor pillar PI may be either an intrinsic semiconductor or a semiconductor having the same conductive type as that of the substrate 100. For example, the semiconductor pillar PI may be either a single crystalline intrinsic semiconductor or a p-type conductivity semiconductor.

A gate dielectric layer 60 may be disposed between the ground select gate electrode 120a and each of the semiconductor pillars PI. The gate dielectric layer 60 may have sidewalls that are convexly curved in opposite directions. The gate dielectric layer 60 may include, for example, a thermal oxide layer or a silicon oxide layer. As shown in FIG. 5, a horizontal dielectric layer 170 may be disposed between each of the vertical channel structures VS and each of the cell and string select gate electrodes 120b and 120c, and also between the gate dielectric layer 60 and the ground select gate electrode 120a. The horizontal dielectric layer 170 may extend onto top and bottom surfaces of the gate electrodes 120a, 120b, and 120c. The horizontal dielectric layer 170 may include, for example, a silicon oxide layer (e.g., $SiO_2$) or a high-k dielectric layer (e.g., aluminum oxide ($Al_2O_3$) or hafnium oxide ($HfO_2$)).

In certain embodiments, a gate structure may be defined to include a single horizontal dielectric layer 170 and a single gate electrode which is disposed between the dielectric patterns 110 adjacent to each other in the third direction Z. For example, a cell gate structure GS1 may be defined to include the cell gate electrode 120b and the horizontal dielectric layer 170 surrounding the cell gate electrode 120b. A string select gate structure GS2 may be defined to include the string select gate electrode 120c and the horizontal dielectric layer 170 surrounding the string select gate electrode 120c. A ground select gate structure GS3 may be defined to include the ground select gate electrode 120a and the horizontal dielectric layer 170 surrounding the ground select gate electrode 120a.

Referring further to FIG. 5, each of the cell and string select gate structures GS1 and GS2 may be disposed between the dielectric patterns 110 adjacent to each other in the third direction Z. Each of the cell and string select gate structures GS1 and GS2 may include a lower part LP and an upper part UP. The lower part LP may be disposed between a pair of upper and lower dielectric patterns 110a and 110b adjacent to each other in the third direction Z. The upper part UP may be disposed between the lower part LP and the upper dielectric pattern 110a which is placed over the lower part LP, of the upper and lower dielectric patterns 110a and 110b adjacent to each other in the third direction Z. Each of the cell and string select gate structures GS1 and GS2 may have a bottom surface 1 and a top surface 3, with a width W1 of the bottom surface 1 along the first direction X from an arbitrary line AL extending in a direction perpendicular to a top surface of the substrate that is greater than a width W2 of the top surface 3 along the first direction X from the same arbitrary line AL (W1>W2). For example, the lower part LP may have at its bottom surface 1 the width W1 greater than the width W2 at the top surface 3 of the upper part UP (W1>W2). The upper dielectric pattern 110a overlying the cell and string select gate structures GS1 and GS2 may have a top surface 5 and a bottom surface 7, and the width W1 at the bottom surface 1 of the lower part LP of the cell and string select gate structures GS1 and GS2 may be substantially the same as a width W3 of the top surface 5 along the first direction X from the same arbitrary line AL (W1=W3). The width W1 at the bottom surface 1 of the lower part LP may be substantially the same as a width of the lower dielectric pattern 110b underlying the lower part LP. The width W2 at the top surface 3 of each of the cell and string select gate structures GS1 and GS2 may be less than the width W3 at the top surface 5 of the upper dielectric pattern 110a overlying the lower part LP (W2<W3). The lower part LP may have a width that remains constant as approaching the upper part UP from the lower dielectric pattern 110b, and the upper part UP may have a width that decreases as approaching the upper dielectric pattern 110a from the lower part LP.

Each of the cell and string select gate electrodes 120b and 120c may have a larger width at its bottom surface 1 and a smaller width at its top surface 3. For example, each of the cell and string select gate electrodes 120b and 120c may include a lower part A' and an upper part B'. The lower part A' may be disposed between the upper and lower dielectric patterns 110a and 110b adjacent to each other in the third direction Z, and the upper part B' may be disposed between the lower part A' and the upper dielectric pattern 110a overlying the lower part A'. The lower part A' may have at its bottom surface 1 a width greater than that at a top surface 3 of the upper part B'. Each of the lower and upper parts A' and B' may have a sidewall adjacent to a charge storage structure 240, and the sidewall of the upper part B' may form an angle θ with respect to the sidewall of the lower part A' that is an obtuse angle (e.g., 90°<θ<180°. The sidewall of upper part B' adjacent to the charge storage structure 240 may be a flat surface substantially without curves. The lower part A' may have its sidewall substantially perpendicular to the top surface of the substrate 100, which sidewall is adjacent to the charge storage structure 240. Alternatively, as shown in FIG. 7, the sidewall of the upper part B' of each of the cell and string select gate electrodes 120b and 120c adjacent to the charge storage structure 240 may have a concave surface that is smoothly curved, whereby the protrusion PS has a convex surface that is smoothly curved.

In certain embodiments, the vertical channel structures VS may penetrate the cell and string select gate structures GS1 and GS2, and may extend from the top surface of the substrate 100 onto first sidewalls S1 of the cell and string select gate structures GS1 and GS2 and also onto first sidewalls S1_a of the dielectric patterns 110 except for a lowermost dielectric pattern 110. In certain embodiments, the first sidewall S1 of the upper part UP of each of the cell and string select gate structures GS1 and GS2 may be recessed from the first sidewall S1_a of the upper dielectric pattern 110a overlying each of the cell and string select gate structures GS1 and GS2. Therefore, on the cell array region CAR of the substrate 100, a first recess region R1 may be provided between the upper dielectric pattern 110a and each of the cell and string select gate structures GS1 and GS2. The vertical channel structure VS may have protrusions PS that protrude from a sidewall thereof. The protrusions PS may contact the cell and string select gate structures GS1 and GS2. Each of the protrusions PS may be disposed in the first recess region R1. For example, the charge storage structure 240 may have protruding portions from its sidewall in contact with the dielectric patterns 110, and the protrusions PS of the vertical channel structure VS may correspond to the protruding portions of the charge storage structure 240. Each of the protruding portions of the charge storage structure 240 may be disposed in the first recess region R1. The protrusions PS may have their top surfaces at the same level as that of bottom surfaces 7 of the dielectric patterns 110. Each of the protrusions PS may be spaced apart from the lower dielectric pattern 110b of the dielectric patterns 110a and 110b adjacent to each other in the third direction Z, and may be in contact with the upper dielectric pattern 110a of the dielectric patterns 110a and 110b adjacent to each other in the third direction Z. In embodiments of the inventive concepts, the charge storage structure 240 may be characterized as including protrusions PS that extend into first recess regions R1 disposed in sidewalls of the cell and string select gate structures GS1 and GS2 at interfaces between the gate structures GS1 and GS2 and the dielectric patterns 110a. The charge storage structure 240 may include a first charge storage segment 240A, a second charge storage segment 240B, and a third charge storage segment 240C. The first charge storage segment 240A may be disposed in the first recess region R1. The first charge storage segment 240A may be disposed between a vertical channel VC and the upper part UP of each of the cell and string select gate structures GS1 and GS2. The second charge storage segment 240B may be disposed between the vertical channel VC and each of the dielectric patterns 110. The third charge storage segment 240C may be disposed between the vertical channel VC and the lower part LP of each of the cell and string select gate structures GS1 and GS2. The first charge storage segment 240A may have a thickness W4 greater than a thickness W5 of the second charge storage segment 240B (W4>W5). The thickness W5 of the second charge storage segment 240B may be substantially the same as a thickness W6 of the third charge storage segment 240C (W5=W6). The thickness W4 of the first charge storage segment 240A may increase as approaching the second charge storage segment 240B from the third charge storage segment 240C. In certain embodiments, the thickness W4 of the first charge storage segment 240A may be about 1.1 to 2 times the thickness W5 of the second charge storage segment 240B. For example, the thickness W4 of the first charge storage segment 240A may be about 1.3 to 1.7 times the thickness W5 of the second charge storage segment 240B.

In certain embodiments, charge storage structures may be formed to have large thicknesses on upper sidewalls of gate electrodes. Accordingly, it may be possible to minimize interference between the gate electrodes vertically adjacent to each other, and also to minimize trapped charges in the charge storage structure on corners of certain gate electrodes from diffusing into the charge storage structure on other gate electrodes vertically adjacent to the certain gate electrodes.

On the top surface of the substrate 100, the vertical channel structures VS may penetrate the cell gate structures GS1 and the string select gate structure GS2. Each of the vertical channel structures VS may include the vertical channel VC and the charge storage structure 240. The vertical channel VC may penetrate the cell gate structures GS1, the string select gate structure GS2, and the dielectric patterns 110 in the third direction Z. The vertical channel VC may have a hollow pipe shape, a cylindrical shape, or a cup shape. The vertical channel VC may include a single layer or a plurality of layers. The vertical channel VC may include, for example, one or more of a single crystalline silicon layer, an organic semiconductor layer, and carbon nanostructures.

The charge storage structure 240 may extend between the vertical channel VC and the cell gate structures GS1, between the vertical channel VC and the string select gate structure GS2, and between the vertical channel VC and the dielectric patterns 110. The bottom surface 7 of the dielectric pattern 110 may have a portion adjacent to the upper part UP of a corresponding one of the cell and string select gate structures GS1 and GS2. The bottom surface 7 of the dielectric pattern 110 may also include a portion not only spaced apart from the corresponding one of the cell and string select gate structures GS1 and GS2, but also covered with the charge storage structure 240. The charge storage structure 240 may contact a sidewall of each of the lower and upper parts LP and UP. The charge storage structure 240 may have a depression D recessed from an outer wall thereof. The outer wall of the charge storage structure 240 may contact the vertical channel VC. The vertical channel VC may be disposed on the outer wall of the charge storage structure 240, and may be placed in the depression D. Thus, the vertical channel VC may have the same profile as that of the charge storage structure 240. For example, the depression D may be located at a level, which is measured from the top surface of the substrate 100, between that of the lower part LP of each of the cell and string select gate structures GS1 and GS2 and that of the upper dielectric pattern 110a overlying the upper part UP of each of the cell and string select gate structures GS1 and GS2.

The charge storage structure 240 may include a tunnel dielectric layer TL, a blocking dielectric layer BLL, and a charge storage layer CTL. The tunnel dielectric layer TL may be disposed adjacent to the vertical channel VC, and may surround an inner wall of the vertical channel VC. The blocking dielectric layer BLL may be disposed adjacent to the cell and string select gate structures GS1 and GS2. The charge storage layer CTL may be disposed between the tunnel dielectric layer TL and the blocking dielectric layer BLL. The tunnel dielectric layer TL may include, for example, a silicon oxide layer or a high-k dielectric layer (e.g., aluminum oxide ($Al_2O_3$) or hafnium oxide ($HfO_2$)). The blocking dielectric layer BLL may include, for example, a silicon oxide layer or a high-k dielectric layer (e.g., aluminum oxide ($Al_2O_3$) or hafnium oxide ($HfO_2$)). The charge storage layer CTL may include, for example, a silicon nitride layer.

In certain embodiments, the blocking dielectric layer BLL may be in contact with the first sidewalls S1 of the cell and string select gate structures GS1 and GS2 and with the first sidewalls S1_a of the dielectric patterns 110, and may be disposed in the first recess region R1. The blocking dielectric layer BLL may have a first depressed portion E1 depressed from an outer wall thereof. The outer wall of the blocking dielectric layer BLL may be closer than an inner wall thereof to the vertical channel VC. The charge storage layer CTL may surround the outer wall of the blocking dielectric layer BLL, and may be disposed in the first depressed portion E1 of the blocking dielectric layer BLL. The charge storage layer CTL may contact the first depressed portion E1. The charge storage layer CTL may have a second depressed portion E2 depressed from an outer wall thereof. The outer wall of the charge storage layer CTL may be closer than an inner wall thereof to the vertical channel VC. The tunnel dielectric layer TL may surround the outer wall of the charge storage layer CTL, and may be disposed in the second depressed portion E2 of the charge storage layer CTL. The tunnel dielectric layer TL may contact the second depressed portion E2. The tunnel dielectric layer TL may have a depression D depressed from an outer wall thereof. The outer sidewall of the tunnel dielectric layer TL may contact the vertical channel VC. The depression D of the tunnel dielectric layer TL may correspond to the depression D of the charge storage structure 240. FIG. 7 includes similar structure as FIG. 5 except for the shape of the sidewall of the upper part B' of each of the cell and string select gate electrodes 120b and 120c and the shape of the first recess region R1, and the respective shapes of protrusion PS, depression D, first depressed portion E1 and second depressed portion E2.

In certain embodiments, in each of the cell strings CSTR described with reference to FIG. 1, the ground select transistor GST may include the ground select gate electrode 120a of one ground select gate structure GS3, the string select transistor SST may include the string select gate electrode 120c of one string select gate structure GS2, and the memory cell transistors MCT may include the cell gate electrodes 120b of four cell gate structures GS1. In one cell string CSTR, the protrusions PS of the vertical channel structure VS may be disposed on sidewalls of four cell gate structures GS1 and a sidewall of one string select gate structure GS2.

In certain embodiments, in each of neighboring cell strings CSTR penetrating the same stack structure ST, the protrusions PS of the vertical channel structure VS may be disposed on each of sidewalls of four cell gate structures GS1 and a sidewall of one string select gate structure GS2.

Gap-fill layers 250 may be disposed in inner spaces surrounded by the vertical channels VC. The gap-fill layers 250 may include, for example, a silicon oxide layer, a silicon nitride layer, or a silicon oxynitride layer. Pads 260 may be disposed on upper portions of the vertical channels VC of the charge storage structures 240, and on upper portions of the gap-fill layers 250. The pads 260 may include a conductive material or a semiconductor material doped with impurities whose conductive type is different from that of the vertical channels VC.

Referring further to FIG. 6A, dummy vertical channel structures DVS may be disposed on the pad region CR of the substrate 100. The dummy vertical channel structures DVS may penetrate the stack structures ST and the interlayer dielectric pattern 200. When viewed in plan, the dummy vertical channel structures DVS may be disposed on end portions of the ground select, cell, and string select gate structures GS3, GS1, and GS2. For example, when viewed in plan, the dummy vertical channel structures DVS may be placed on edges of the end portions of the ground select, cell, and string select gate structures GS3, GS1, and GS2. Each of the dummy vertical channel structures DVS may include a dummy vertical channel DVC and a dummy charge storage structure D240.

On the pad region CR of the substrate 100, the dummy vertical channel DVC on the end portion of the string select gate structure GS2 may penetrate the cell gate structures GS1, the string select gate structure GS2, and the dielectric patterns 110. On the pad region CR of the substrate 100, the dummy vertical channel structure DVS on the end portions of the cell gate structures GS2 may penetrate the cell gate structures GS1, the dielectric patterns 110, and the interlayer dielectric pattern 200. The dummy vertical channel structure DVS on the end portion of the ground select gate structure GS3 may penetrate the interlayer dielectric pattern 200. The dummy charge storage structure D240 may be disposed adjacent to the cell and string select gate structures GS1 and GS2, and the dummy vertical channel DVC may surround an outer wall of the dummy charge storage structure D240. The dummy charge storage structure D240 may have an inner wall in contact with the cell and string select gate structures GS1 and GS2 and with the dielectric patterns 110. The dummy vertical channel DVC may be formed of the same material as that of the vertical channel VC, and the dummy charge storage structure D240 may be formed of the same material as that of the charge storage structure 240.

In certain embodiments, the dummy vertical channel structure DVS may penetrate the cell and string select gate structures GS1 and GS2, and may extend from the top surface of the substrate 100 onto second sidewalls S2 of the cell and string select gate structures GS1 and GS2 and also onto second sidewalls S2_a of the dielectric patterns 110. In certain embodiments, the second sidewall S2 of the upper part UP of each of the cell and string select gate structures GS1 and GS2 may be recessed from the second sidewall S2_a of the upper dielectric pattern 110a overlying each of the cell and string select gate structures GS1 and GS2. Therefore, on the pad region CR of the substrate 100, a second recess region R2 may be provided between each of the cell and string select gate structures GS1 and GS2 and the upper dielectric pattern 110a immediately overlying the each of the cell and string select gate structures GS1 and GS2. The dummy vertical channel structure DVS may have dummy protrusions DPS that protrude from its inner wall in contact with the dielectric patterns 110. The dummy protrusions DPS may contact the cell and string select gate structures GS1 and GS2. Each of the dummy protrusions DPS may be disposed in the second recess region R2. For example, the dummy charge storage structure D240 may have protruding portions from its sidewall in contact with the dielectric patterns 110, and the dummy protrusions DPS of the dummy vertical channel structure DVS may correspond to the protruding portions of the dummy charge storage structure D240. Each of the protruding portions of the dummy charge storage structure D240 may be disposed in the second recess region R2.

In certain embodiments, when no sufficient distance is provided between the dummy vertical channel structures DVS adjacent to each other in the first direction X, or when widths of the dummy vertical channel structures DVS are greater than those of the vertical channel structures VS, the dummy protrusions DPS of the dummy vertical channel structures DVS adjacent to each other in the first direction X may be in contact with each other. For example, the dummy charge storage structures D240 of the dummy vertical channel structures DVS adjacent to each other in the first direction X may be in contact with each other as shown in FIG. 6A. A portion of the cell gate structure GS1 between the dummy protrusions DPS may be spaced apart from the upper dielectric pattern 110a immediately overlying the portion of the cell gate structure GS1. In certain embodiments, as shown in FIG. 6B, the dummy protrusions DPS of the dummy vertical channel structures DVS adjacent to each other in the first direction X may be spaced apart from each other, and an air gap AG may be provided between the dummy protrusions DPS. The air gap AG may be interposed between a portion of the cell gate structure GS1 between the dummy protrusions DPS and the upper dielectric pattern 110a immediately overlying the portion of the cell gate structure GS1.

Figure 8:
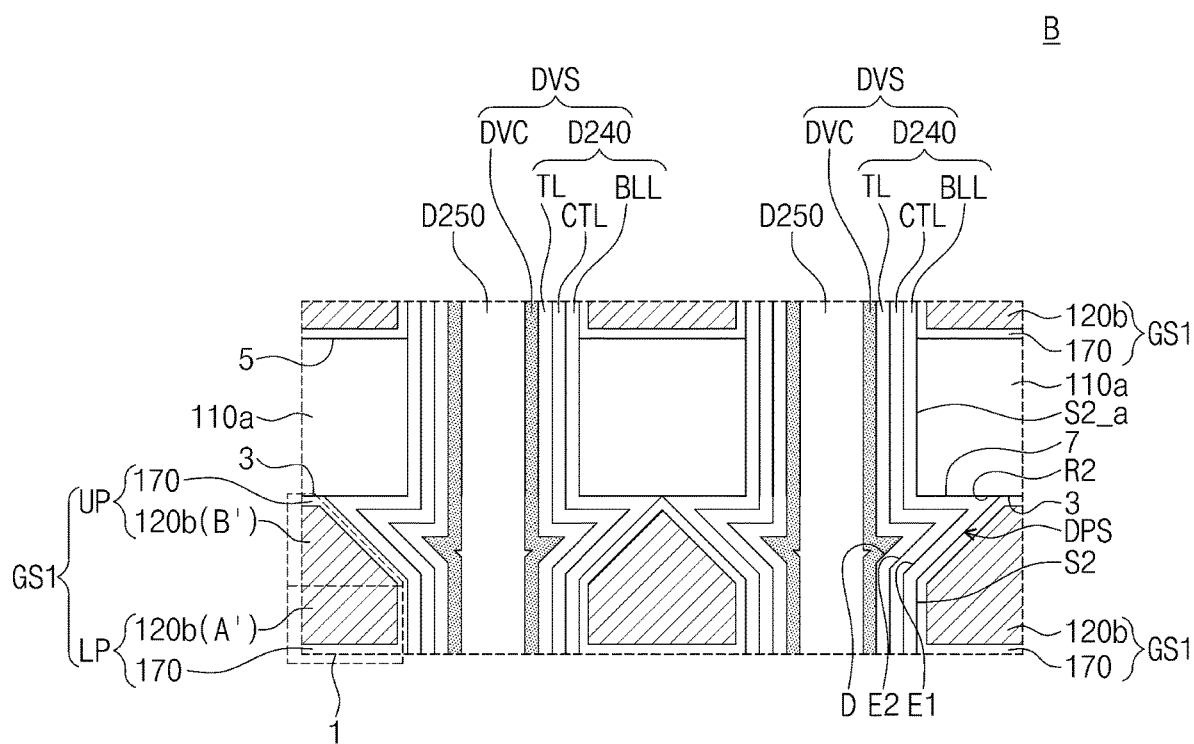
FIG. 8 illustrates an enlarged view of section B in FIG. 4, showing a three-dimensional semiconductor memory device according to some example embodiments of the inventive concepts

In other embodiments, as shown in FIG. 8, when a sufficient distance is provided between the dummy vertical channel structures DVS adjacent to each other in the first direction X, the dummy protrusions DPS of the dummy vertical channel structures DVS adjacent to each other in the first direction X may be spaced apart from each other. A portion of the cell gate structure GS1 between the dummy protrusions DPS may be in contact with the upper dielectric pattern 110a immediately overlying the portion of the cell gate structure GS1.

The dummy vertical channels DVC may have the same deposited shape as that of the vertical channels VC, and the dummy charge storage structures D240 may have the same deposited shape as that of the charge storage structures 240. In addition, likewise the charge storage structure 240, the dummy charge storage structure D240 may include a blocking dielectric layer BLL, a charge storage layer CTL, and a tunnel dielectric layer TL. The dummy vertical channels DVC and the dummy charge storage structures D240 may have the same structural characteristics as those of the vertical channels VC and the charge storage structures 240, respectively. Therefore, the structural explanations of the vertical channels VC and the charge storage structures 240 may also be applicable to the dummy vertical channels DVC and the dummy charge storage structures D240, and further detailed description of the dummy vertical channels DVC and the dummy charge storage structures D240 may be omitted for brevity.

Dummy semiconductor pillars DPI may be disposed between the substrate 100 and the dummy vertical channel structures DVS. The dummy semiconductor pillars DPI may penetrate the ground select gate structure GS3. A dummy gate dielectric layer D60 may be disposed between the ground select gate structure GS3 and each of the dummy semiconductor pillars DPI. Dummy gap-fill layers D250 may be disposed in inner spaces surrounded by the dummy vertical channels DVC. Dummy pads D260 may be disposed on upper portions of the dummy vertical channels DVC, of the dummy charge storage structures D240, and of the dummy gap-fill layers D250.

A first interlayer dielectric layer 310 may be disposed on the top surfaces of the stack structures ST and on a top surface of the interlayer dielectric pattern 200. The first interlayer dielectric layer 310 may include, for example, one or more of a silicon oxide layer, a silicon nitride layer, and a silicon oxynitride layer.

A contact structure 340 may be disposed between the stack structures ST adjacent to each other in the second direction Y. The contact structure 340 may extend in the first direction X and may penetrate the first interlayer dielectric layer 310. When viewed in plan, the contact structure 340 may have a rectangular or linear shape extending in the first direction X. Alternatively, the contact structure 340 may be provided in plural, and the plurality of contact structures 340 may be arranged in the first direction X along the common source region CSR. In this case, the plurality of contact structures 340 may have pillar shapes.

The contact structure 340 may include a spacer 320 and a common source contact 330. The common source contact 330 may be electrically connected to the common source region CSR. The common source contact 330 may include, for example, metal (e.g., tungsten, copper, or aluminum) or transition metal (e.g., titanium or tantalum). The spacer 320 may surround a sidewall of the common source contact 330.

The spacer 320 may include, for example, a dielectric material such as a silicon oxide layer or a silicon nitride layer.

A second interlayer dielectric layer 350 may be disposed on the first interlayer dielectric layer 310. The second interlayer dielectric layer 350 may cover a top surface of the first interlayer dielectric layer 310 and a top surface of the contact structure 340. The second interlayer dielectric layer 350 may include, for example, a silicon oxide layer.

Cell contact plugs 410 may be disposed on the pad region CR of the substrate 100. The cell contact plugs 410 may be placed on the end portions of the gate structures GS1, GS2, and GS3 of the stack structures ST. For example, the cell contact plugs 410 may directly contact top surfaces of the distal ends of the gate electrodes 120a, 120b, and 120c. The cell contact plugs 410 may include for example one or more of metal (e.g., copper or tungsten) and metal nitride (e.g., TiN, TaN, or WN).

Channel contact plugs 420 may be provided on the pads 260 disposed on the vertical channel structures VS. The channel contact plugs 420 may penetrate the second interlayer dielectric layer 350 and the first interlayer dielectric layer 310, thereby directly contacting the pads 260. The channel contact plugs 420 may include, for example, one or more of metal (e.g., copper or tungsten) and metal nitride (e.g., TiN, TaN, or WN). In certain embodiments, the channel contact plugs 420 may not be provided on the dummy pads D260 disposed on the dummy vertical channel structures DVS.

Connection lines 430 may be disposed on the second interlayer dielectric layer 350. The connection lines 430 may be electrically connected to the cell contact plugs 410.

Bit lines BL may be disposed on the second interlayer dielectric layer 350. The bit lines BL may extend in the second direction Y, and may run across the stack structures ST. The bit lines BL may be electrically connected to corresponding channel contact plugs 420.

Figure 9:
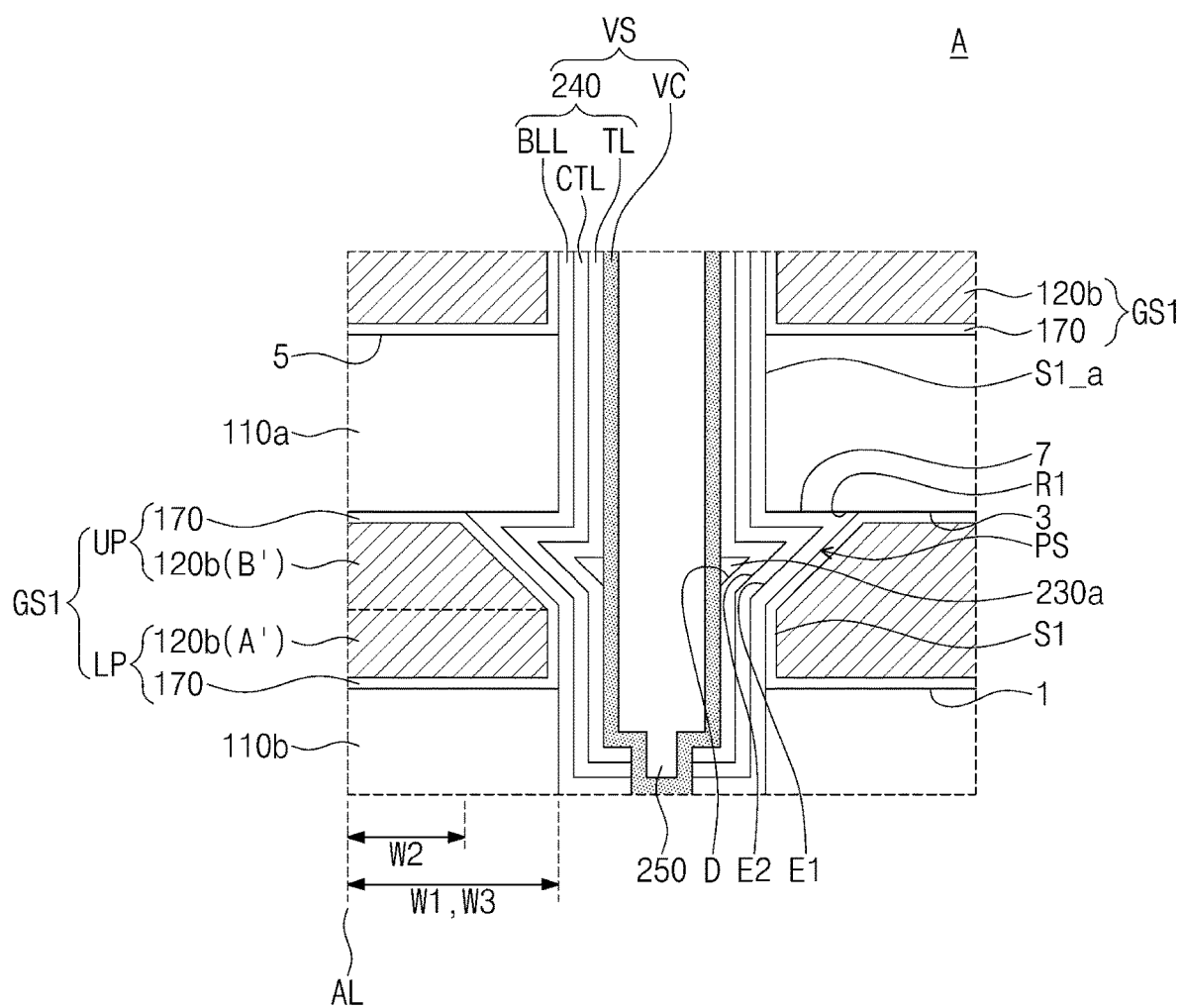
FIG. 9 illustrates an enlarged view of section A in FIG. 3, showing a three-dimensional semiconductor memory device according to some example embodiments of the inventive concepts.

FIG. 9 illustrates an enlarged view of section A in FIG. 3, showing a three-dimensional semiconductor memory device according to some example embodiments of the inventive concepts. FIG. 9 includes similar structure as shown in FIG. 5, and the following description will focus on differences between the embodiments of FIGS. 5 and 9.

Referring to FIG. 9, a capping pattern 230a may be disposed in the depression D of the charge storage structure 240. The capping pattern 230a may have a sidewall aligned with the outer wall of the charge storage structure 240. The vertical channel VC may extend in the third direction Z along the sidewall of the capping pattern 230a and the outer wall of the charge storage structure 240. The vertical channel VC may have a flat sidewall in contact with the gap-fill layer 250. The capping pattern 230a may include, for example, a silicon oxide layer or a high-k dielectric layer (e.g., aluminum oxide ($Al_2O_3$) or hafnium oxide ($HfO_2$)). The capping pattern 230a may include the same material as that of the tunnel dielectric layer TL.

Figure 10:
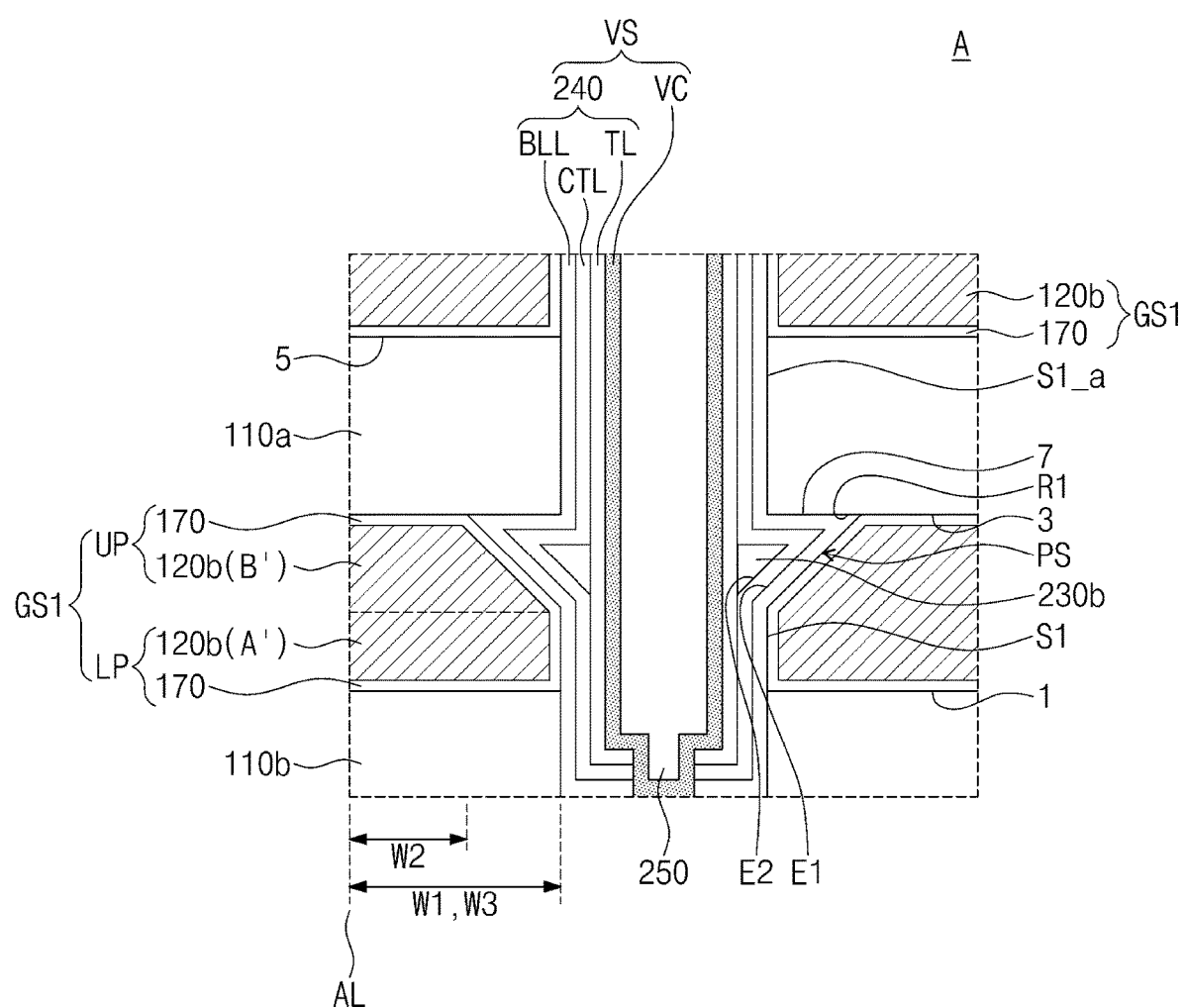
FIG. 10 illustrates an enlarged view of section A in FIG. 3, showing a three-dimensional semiconductor memory device according to some example embodiments of the inventive concepts.

FIG. 10 illustrates an enlarged view of section A in FIG. 3, showing a three-dimensional semiconductor memory device according to some example embodiments of the inventive concepts. FIG. 10 includes similar structure as shown in FIG. 5, and the following description will focus on differences between the embodiments of FIGS. 5 and 10.

Referring to FIG. 10, a capping pattern 230b may be disposed in the second depressed portion E2 of the charge storage layer CTL. The capping pattern 230b may have a sidewall aligned with the outer wall of the charge storage layer CTL. The tunnel dielectric layer TL may extend in the third direction Z along the sidewall of the capping pattern 230b and the outer wall of the charge storage layer CTL. The tunnel dielectric layer TL may have a flat sidewall in contact with the vertical channel VC.

Figure 11:
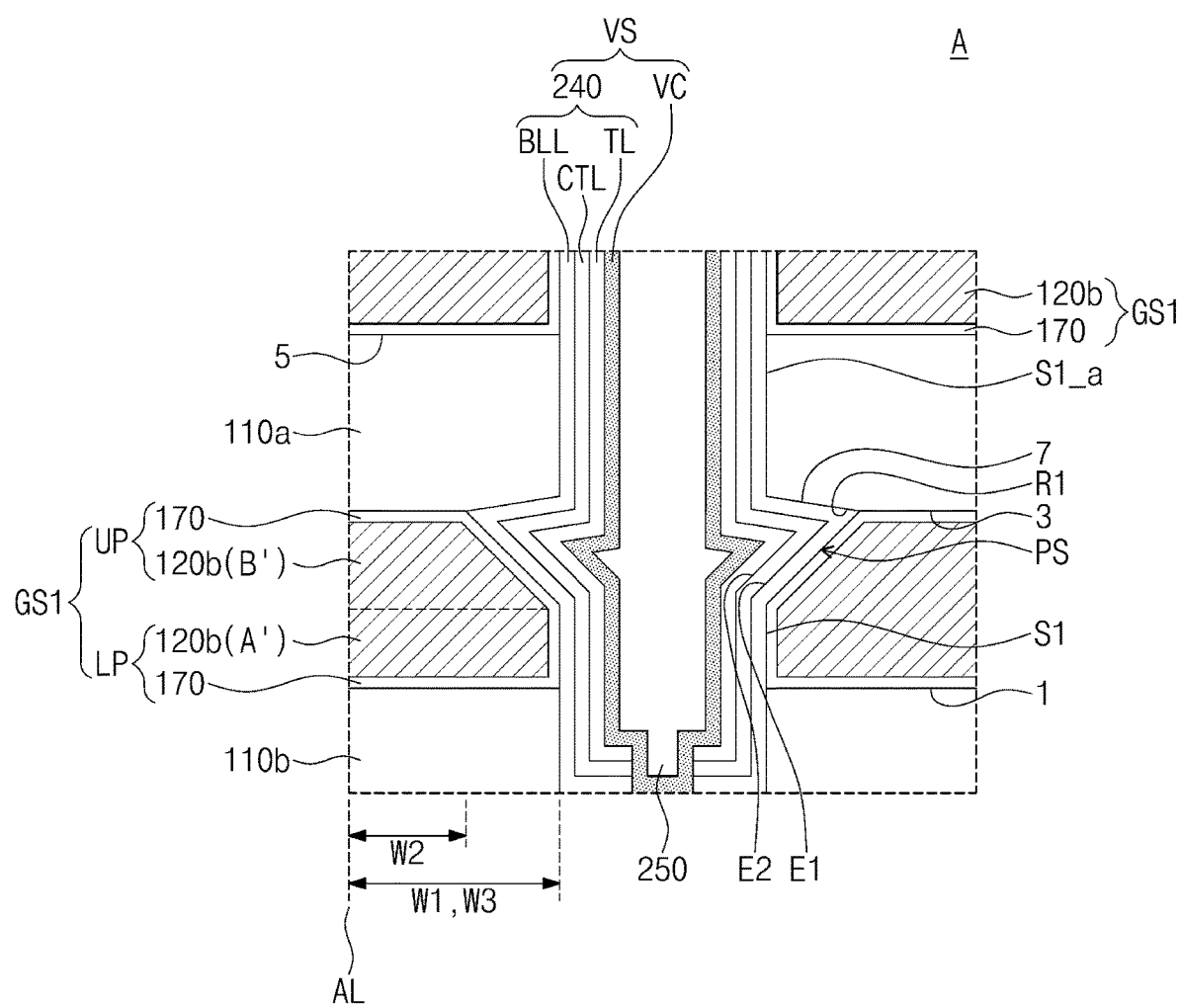
FIG. 11 illustrates an enlarged view of section A in FIG. 3, showing a three-dimensional semiconductor memory device according to some example embodiments of the inventive concepts.

FIG. 11 illustrates an enlarged view of section A in FIG. 3, showing a three-dimensional semiconductor memory device according to some example embodiments of the inventive concepts. FIG. 11 includes similar structure as shown in FIG. 5, and the following description will focus on differences between the embodiments of FIGS. 5 and 11.

Referring to FIG. 11, the bottom surface 7 of the upper dielectric pattern 110a may have a first portion that is covered with the horizontal dielectric layer 170 and that is flat with respect to the top surface of the substrate 100. The bottom surface 7 of the upper dielectric pattern 110a may also have a second portion that is covered with the charge storage structure 240 and is not flat with respect to the top surface of the substrate 100. For example, the second portion of the bottom surface 7 covered with the charge storage structure 240 may have an obtuse angle with respect to the first sidewall S1_a of the upper dielectric pattern 110a.

Figure 12:
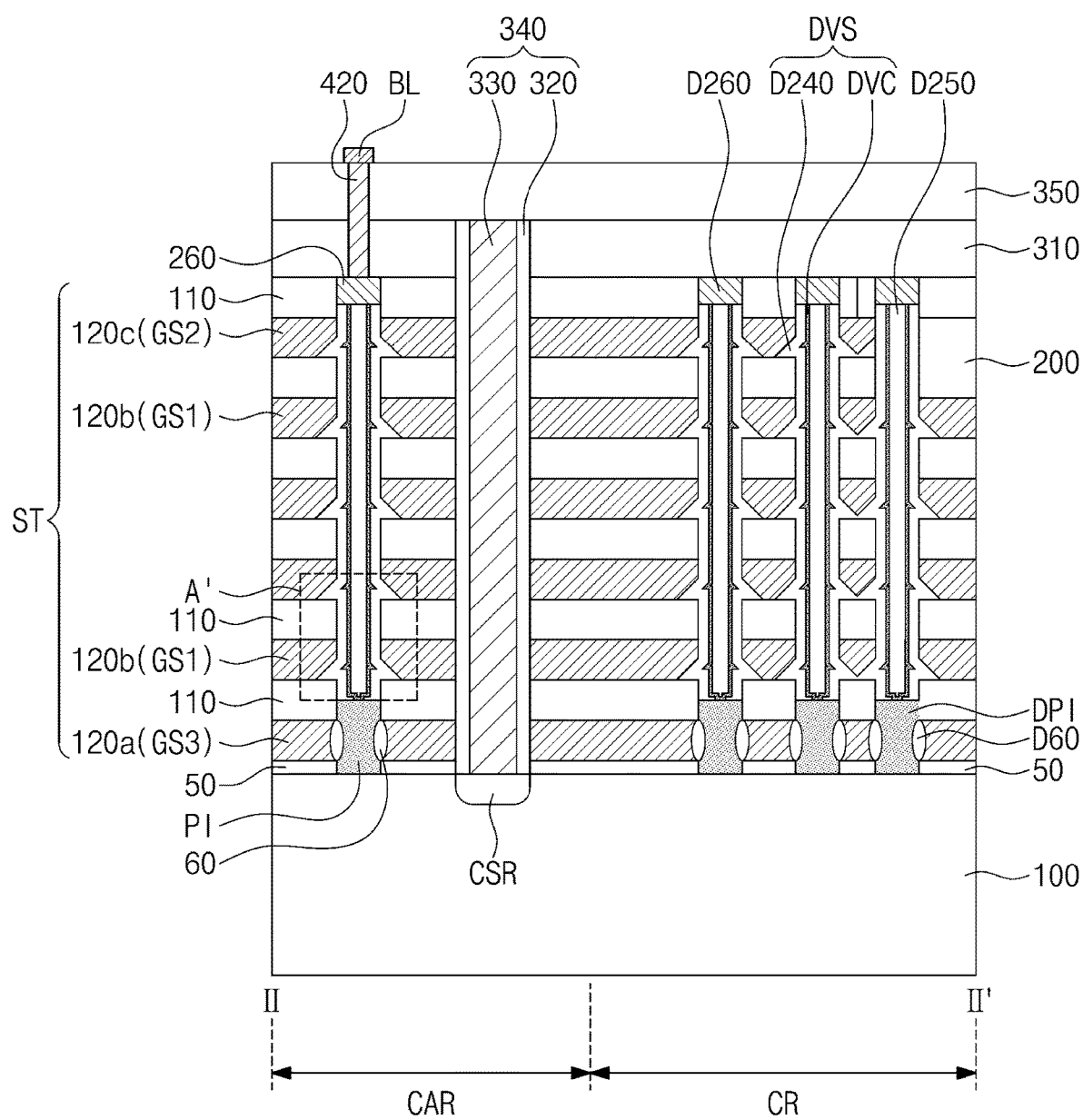
FIG. 12 illustrates a cross-sectional view taken along line II-II' of FIG. 2, showing a three-dimensional semiconductor memory device according to some example embodiments of the inventive concepts.
Figure 13:
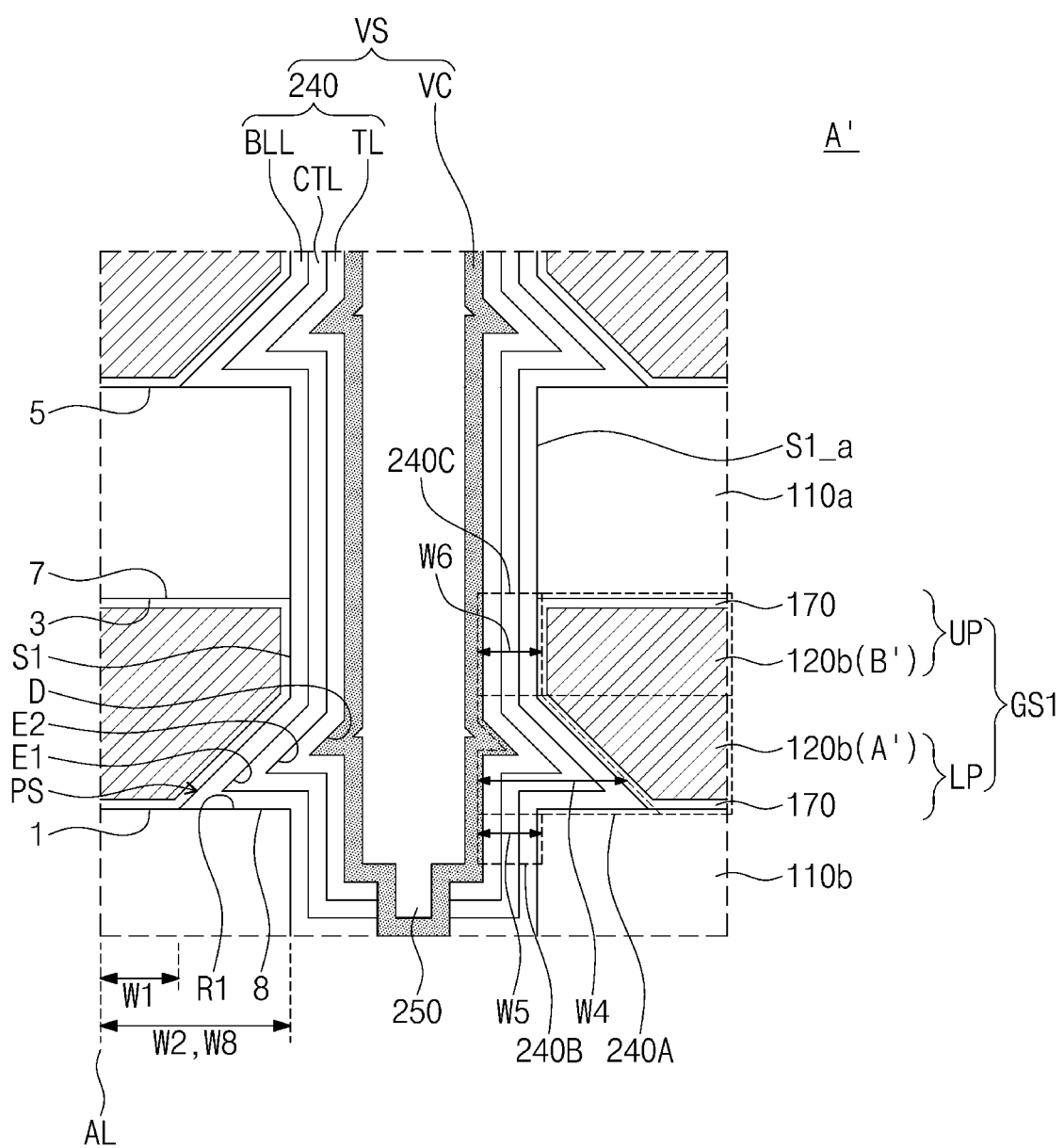
FIG. 13 illustrates an enlarged view of section A' in FIG. 12.

FIG. 12 illustrates a cross-sectional view taken along line II-II' of FIG. 2, showing a three-dimensional semiconductor memory device according to some example embodiments of the inventive concepts. FIG. 13 illustrates an enlarged view of section A' in FIG. 12.

Referring to FIGS. 12 and 13, the first recess region R1 may be provided between the lower dielectric pattern 110b and each of the cell and string select gate structures GS1 and GS2. The first recess region R1 may correspond to a region where the first sidewall S1 of each of the cell and string select gate structures GS1 and GS2 is recessed from the first sidewall S1_a of the lower dielectric pattern 110b. The first recess region R1 may partially expose a top surface 8 of the lower dielectric pattern 110b. Each of the protrusions PS of the vertical channel structure VS may be disposed in the first recess region R1. The protrusion PS of the vertical channel structure VS may partially cover the top surface 8 of the lower dielectric pattern 110b. In certain embodiments, the protrusion PS may have a bottom surface at the same level as that of the top surface 8 of the dielectric pattern 110. Each of the cell and string select gate structures GS1 and GS2 may include the lower part LP and the upper part UP. The width W1 of the bottom surface 1 of the lower part LP may be less than the width W2 of the top surface 3 of the upper part UP (W1<W2). The width W1 of the bottom surface 1 of the lower part LP may be less than a width W8 of the bottom surface 7 of the upper dielectric pattern 110a (W1<W8).

The charge storage structure 240 may include the first charge storage segment 240A, the second charge storage segment 240B, and the third charge storage segment 240C. The first charge storage segment 240A may be disposed between the vertical channel VC and the lower part LP of each of the cell and string select gate structures GS1 and GS2. The second charge storage segment 240B may be disposed between the vertical channel VC and each of the dielectric patterns 110. The third charge storage segment 240C may be disposed between the vertical channel VC and the upper part UP of each of the cell and string select gate structures GS1 and GS2. The thickness W4 of the first charge storage segment 240A may be greater than the thickness W5 of the second charge storage segment 240B (W4>W5). The thickness W5 of the second charge storage segment 240B may be substantially the same as the thickness W6 of the third charge storage segment 240C (W5=W6). The thickness W4 of the first charge storage segment 240A may increase as approaching the second charge storage segment 240B from the third charge storage segment 240C.

Figure 14:
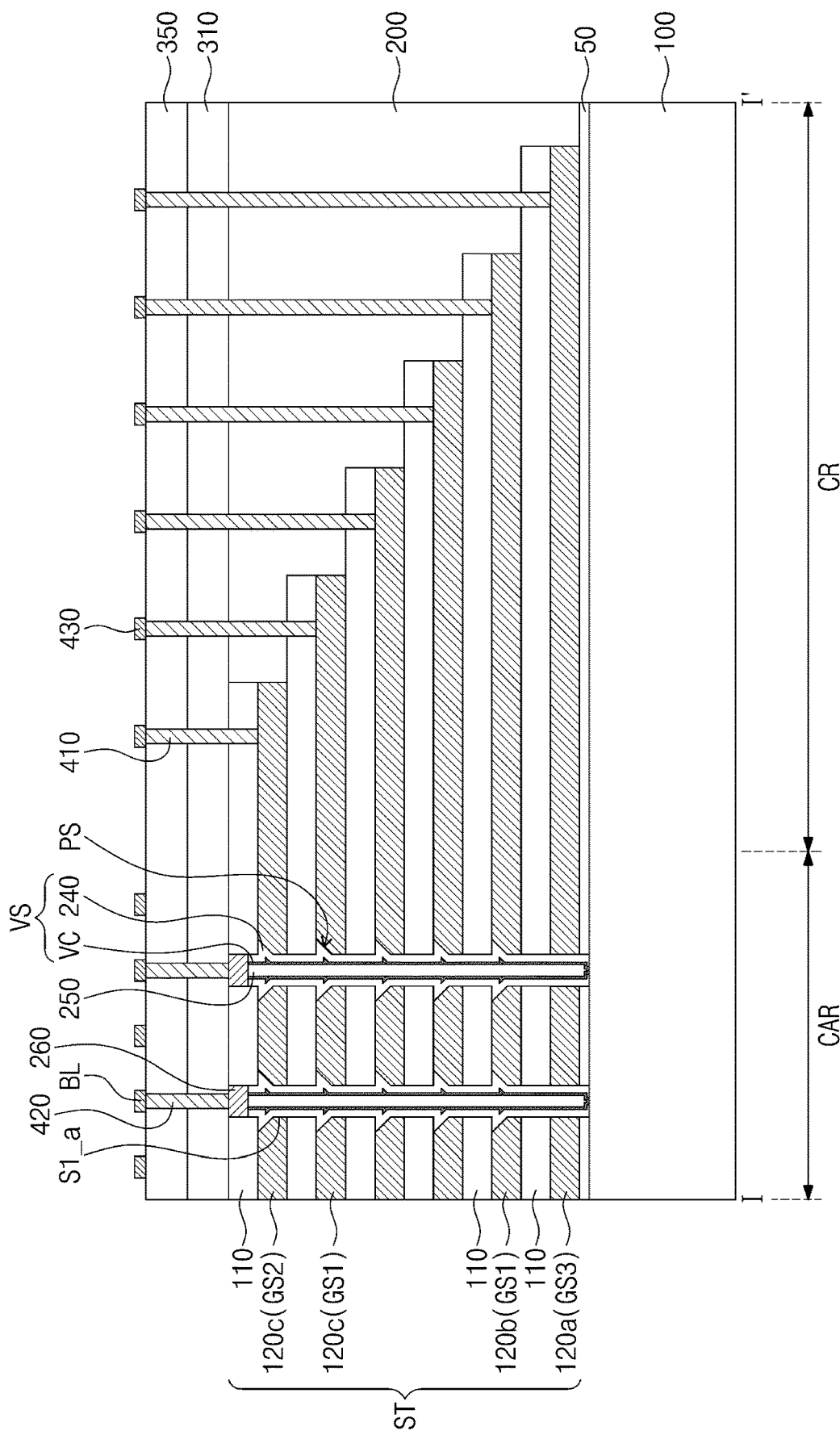
FIG. 14 illustrates a cross-sectional view taken along line I-I' of FIG. 2, showing a three-dimensional semiconductor memory device according to some example embodiments of the inventive concepts.
Figure 15:
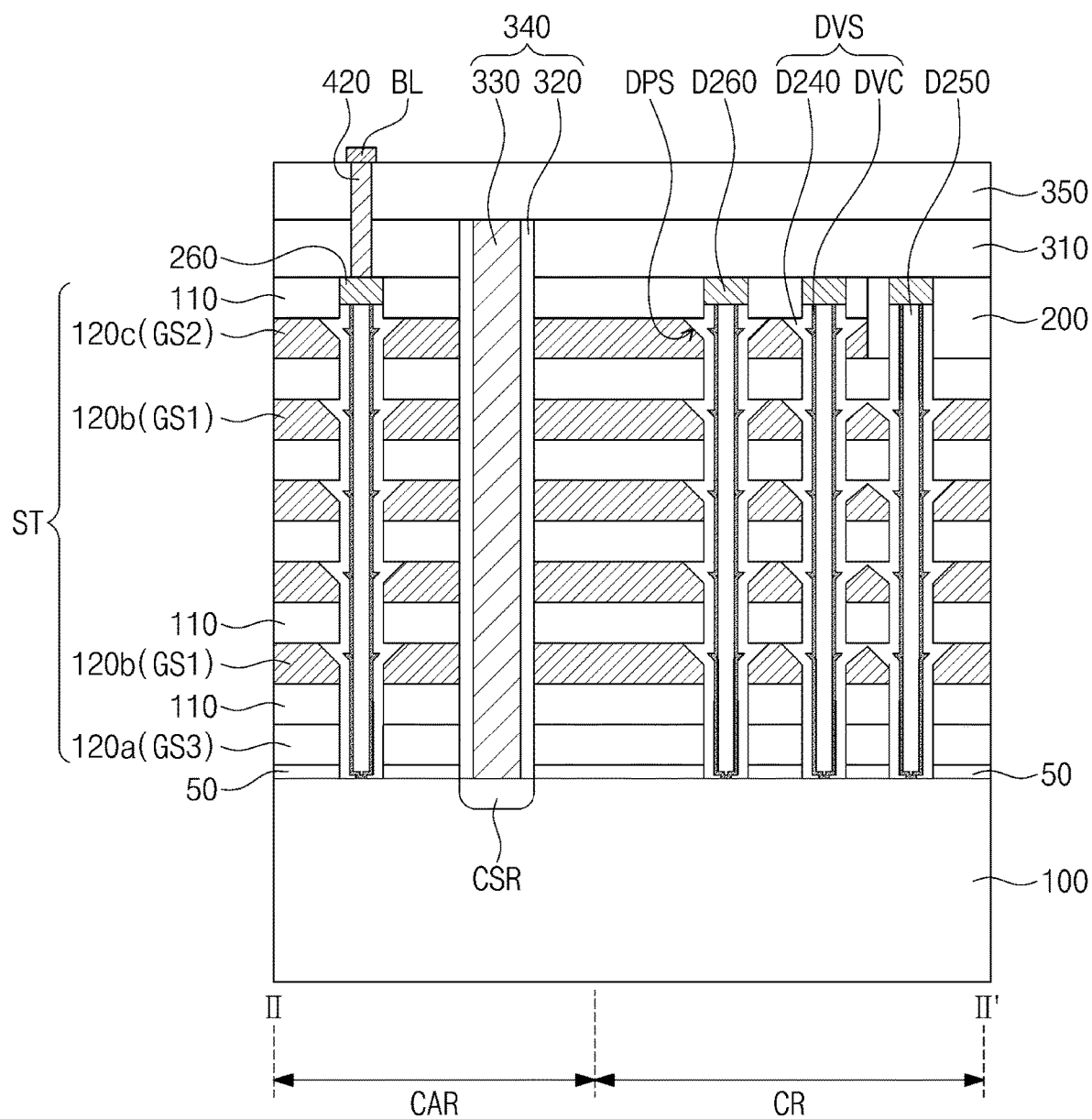
FIG. 15 illustrates a cross-sectional view taken along line II-II' of FIG. 2, showing a three-dimensional semiconductor memory device according to some example embodiments of the inventive concepts.

FIG. 14 illustrates a cross-sectional view taken along line I-I' of FIG. 2, showing a three-dimensional semiconductor memory device according to some example embodiments of the inventive concepts. FIG. 15 illustrates a cross-sectional view taken along line II-II' of FIG. 2, showing a three-dimensional semiconductor memory device according to some example embodiments of the inventive concepts.

Referring to FIGS. 14 and 15, the vertical channel structure VS, the dummy vertical channel structure DVS, the gap-fill layer 250, and the dummy gap-fill layer D250 may be in contact with the top surface of the substrate 100. For example, the present embodiment may include neither the semiconductor pillar PI nor the dummy semiconductor pillar DPI described previously with reference to FIGS. 3 and 4. The vertical channel structure VS may have a flat sidewall in contact with the ground select gate structure GS3. For example, the vertical channel structure VS may have no protrusion PS in contact with the ground select gate structure GS3. In addition, the dummy vertical channel structure DVS may have no dummy protrusion DPS in contact with the ground select gate structure GS3.

Figure 16:
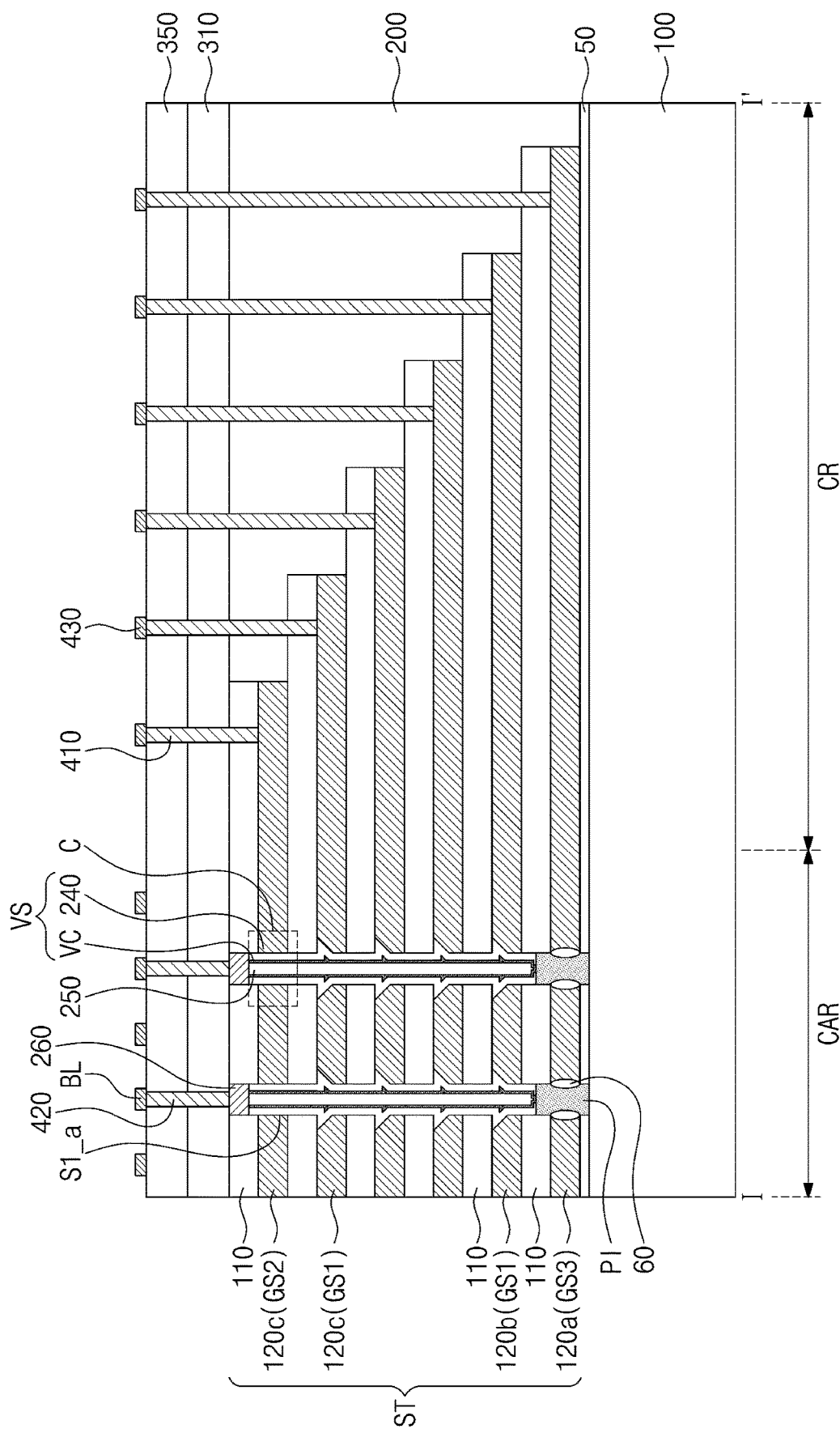
FIG. 16 illustrates a cross-sectional view taken along line I-I' of FIG. 2, showing a three-dimensional semiconductor memory device according to some example embodiments of the inventive concepts.
Figure 17:
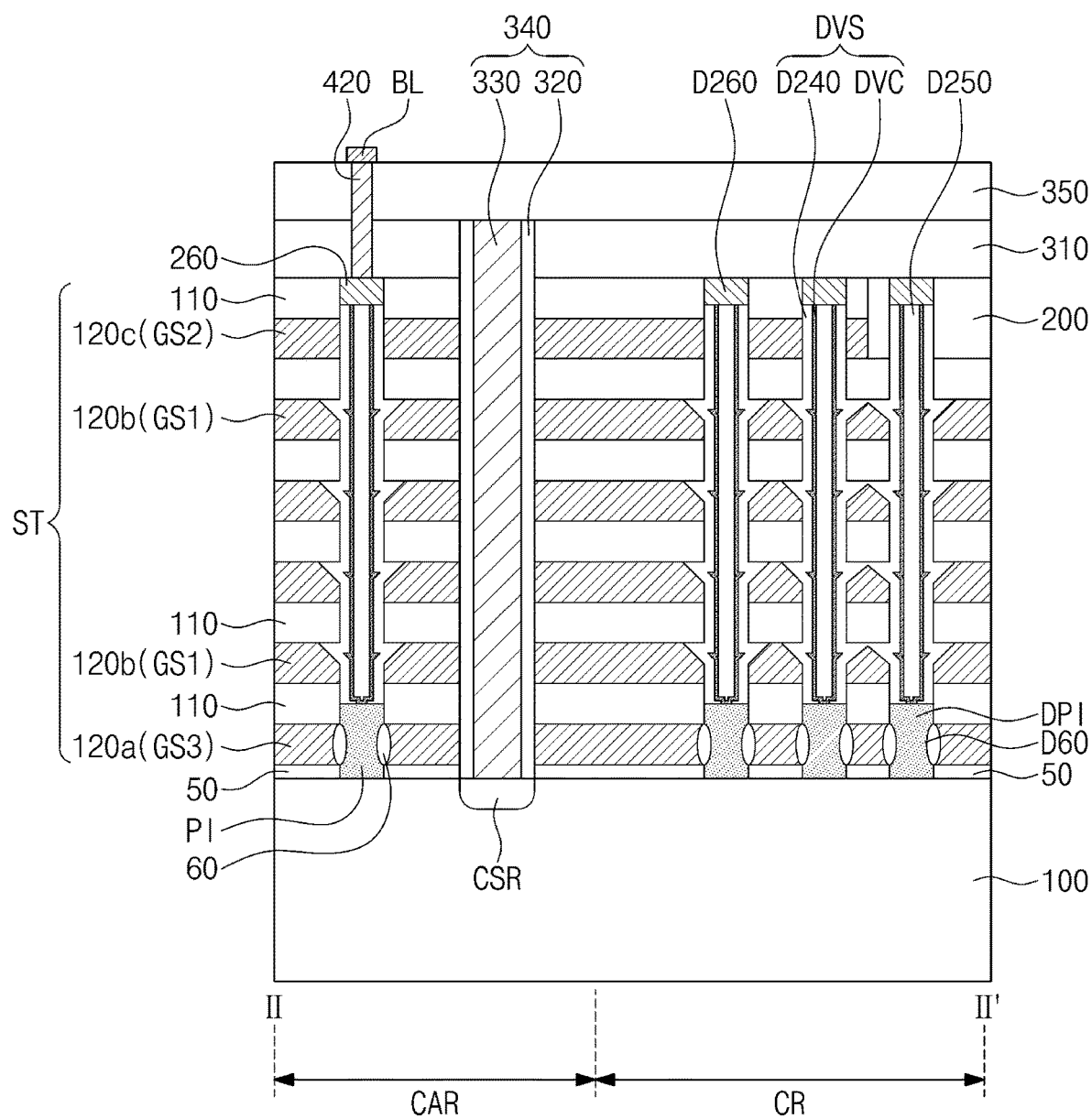
FIG. 17 illustrates a cross-sectional view taken along line II-II' of FIG. 2, showing a three-dimensional semiconductor memory device according to some example embodiments of the inventive concepts.
Figure 18:
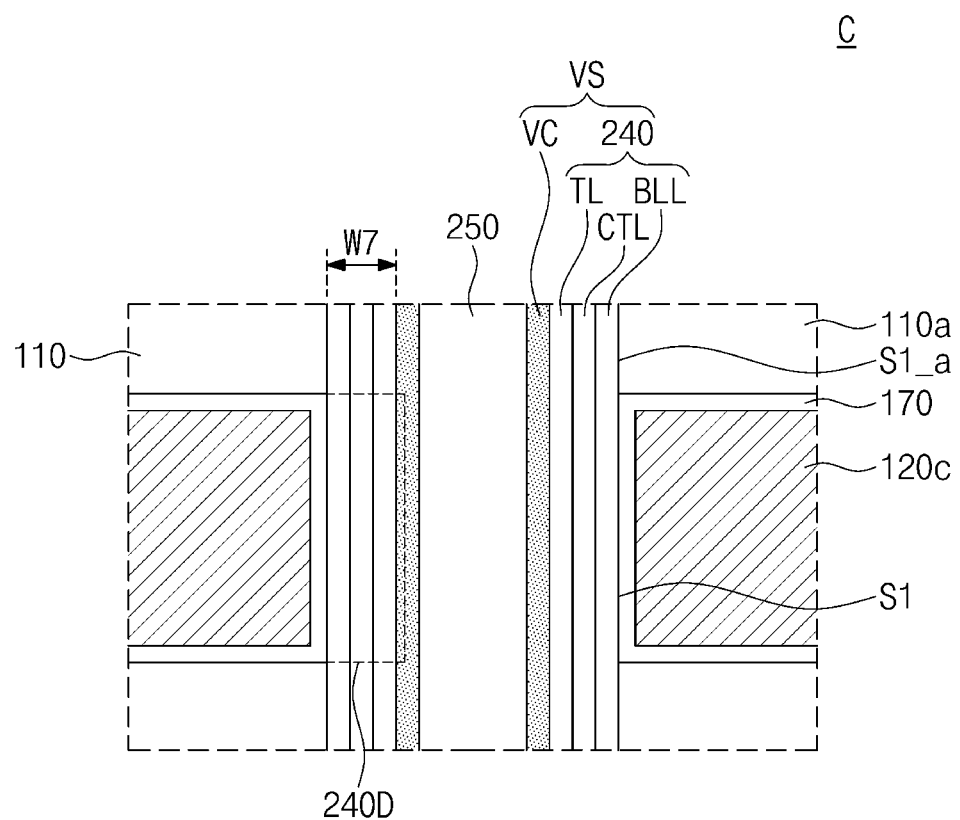
FIG. 18 illustrates an enlarged view of section C in FIG. 16.

FIG. 16 illustrates a cross-sectional view taken along line I-I' of FIG. 2, showing a three-dimensional semiconductor memory device according to some example embodiments of the inventive concepts. FIG. 17 illustrates a cross-sectional view taken along line II-II' of FIG. 2, showing a three-dimensional semiconductor memory device according to some example embodiments of the inventive concepts. FIG. 18 illustrates an enlarged view of section C in FIG. 16.

Referring to FIGS. 16, 17, and 18, the vertical channel structure VS may have a flat sidewall in contact with the string select gate structure GS2. For example, the present embodiment may have no protrusion PS in contact with the string select gate structure GS2, in contrast to the embodiments described with reference to FIGS. 3 and 4. The first sidewall S1 at an upper portion of the string select gate structure GS2 may be aligned with the first sidewall S1_a of the upper dielectric pattern 110a on the string select gate structure GS2.

The charge storage structure 240 may include a fourth charge storage segment 240D between the string select gate structure GS2 and the vertical channel VC. The fourth charge storage segment 240D may have a thickness W7 less than the thickness (see W4 of FIG. 5) of the first charge storage segment (see 240A of FIG. 5).

Figure 19:
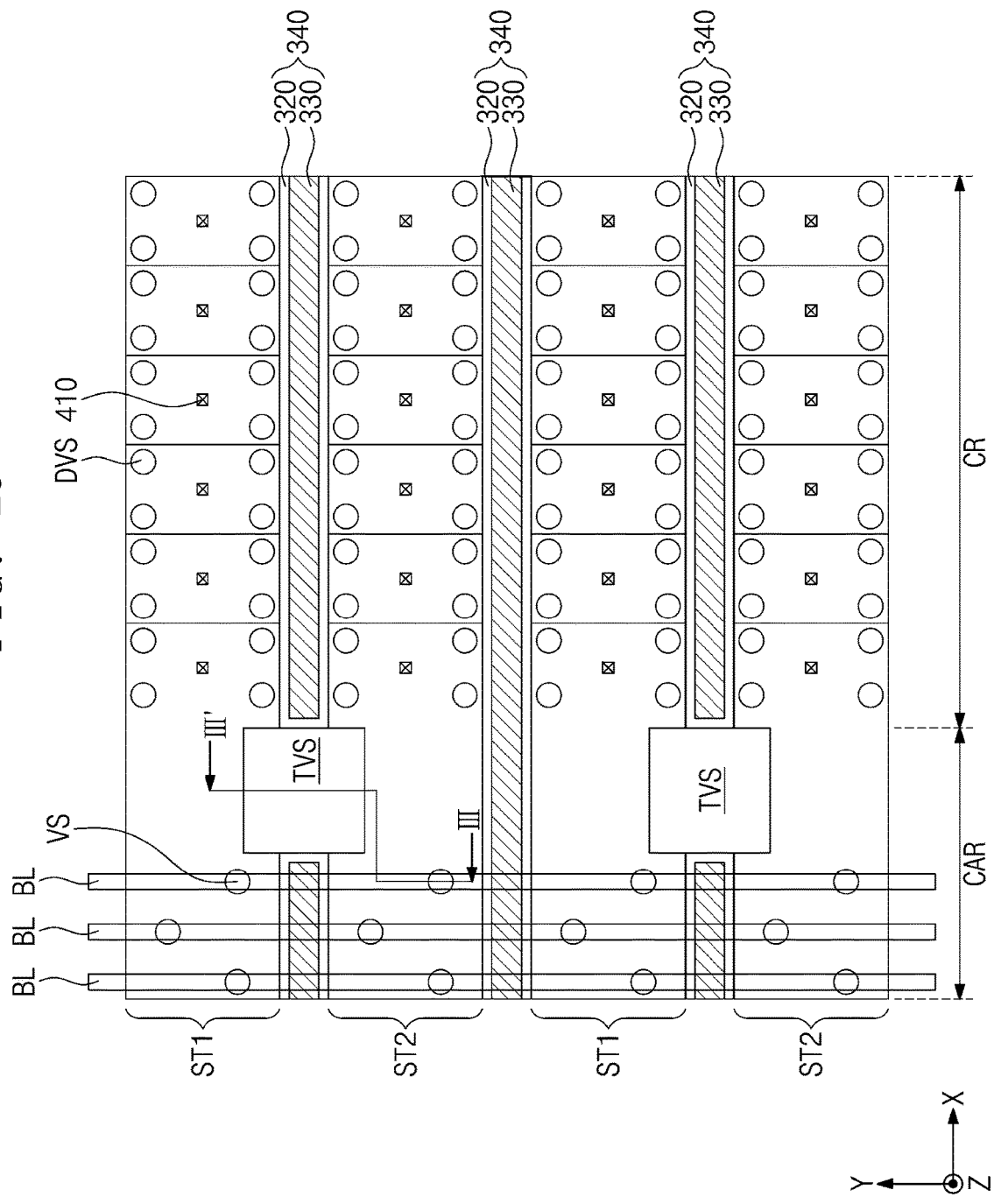
FIG. 19 illustrates a plan view showing a three-dimensional semiconductor memory device according to some example embodiments of the inventive concepts.
Figure 20:
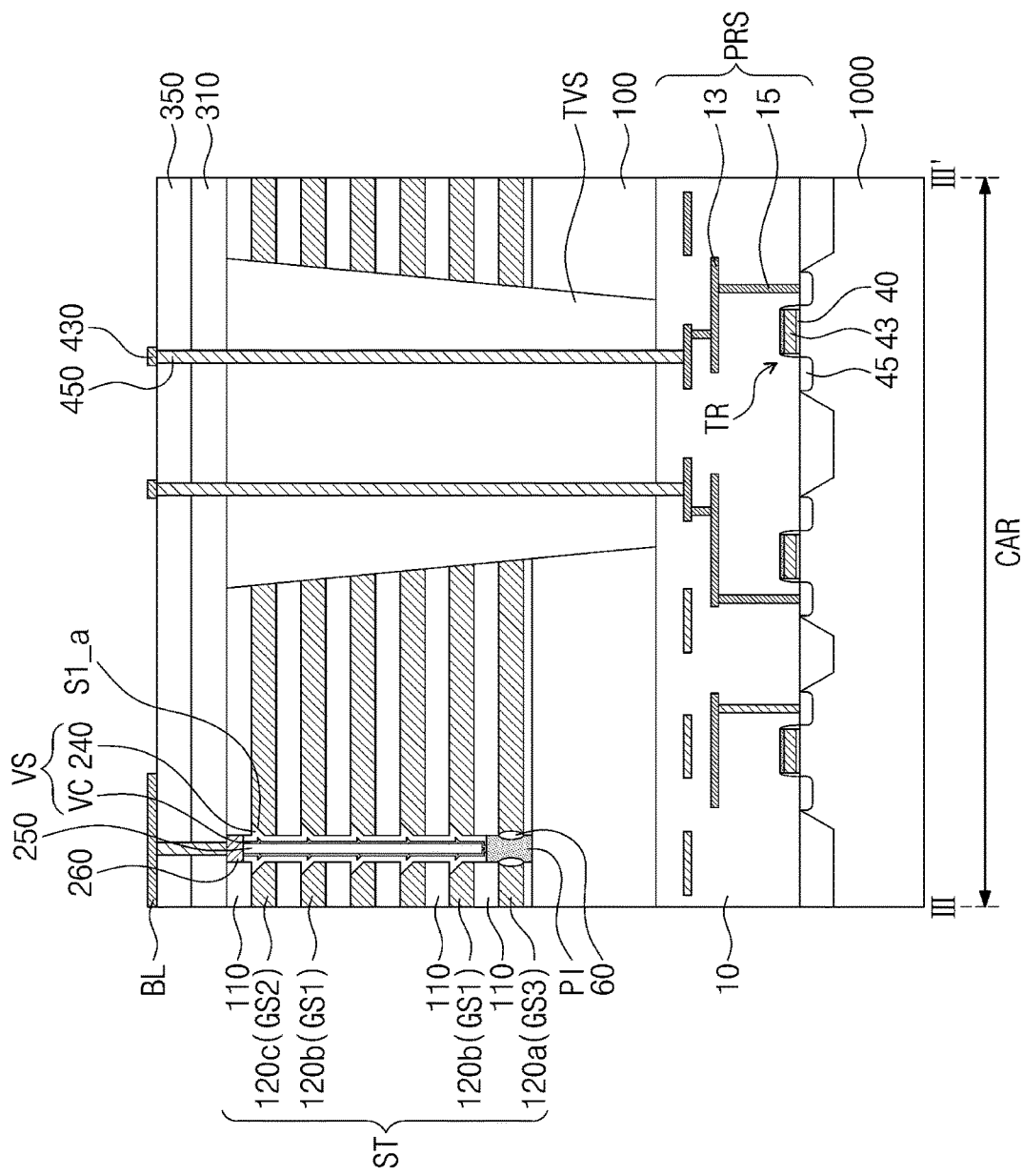
FIG. 20 illustrates a cross-sectional view taken along line III-III' of FIG. 19, showing a three-dimensional semiconductor memory device according to some example embodiments of the inventive concepts.

FIG. 19 illustrates a plan view showing a three-dimensional semiconductor memory device according to some example embodiments of the inventive concepts. FIG. 20 illustrates a cross-sectional view taken along line III-III' of FIG. 19, showing a three-dimensional semiconductor memory device according to some example embodiments of the inventive concepts.

Referring to FIGS. 19 and 20, the substrate 100 may be provided thereon with a first stack structure ST1 and a second stack structure ST2 that are alternately arranged along the second direction Y. The contact structure 340 may be disposed between the first stack structures ST1 and the second stack structures ST2 adjacent to each other in the second direction Y, extending in the first direction X. A lower substrate 1000 may be disposed below the substrate 100, and a peripheral circuit structure PRS may be placed between the lower substrate 1000 and the substrate 100. The lower substrate 1000 may be for example a silicon substrate, a silicon-germanium substrate, a germanium substrate, or a single crystalline epitaxial layer grown on a single crystalline silicon substrate.

The peripheral circuit structure PRS may include transistors TR, a peripheral circuit interlayer dielectric layer 10, wiring pads 13, and vias 15. The transistors TR may be disposed on active regions of the lower substrate 1000. The transistors TR may each include a peripheral gate dielectric layer 40, a peripheral gate electrode 43, and source/drain regions 45. The peripheral circuit interlayer dielectric layer 10 may be disposed on the lower substrate 1000. The peripheral circuit interlayer dielectric layer 10 may cover the transistors TR. The wiring pads 13 and the vias 15 may be disposed in the peripheral circuit interlayer dielectric layer 10. The wiring pads 13 located at different levels may be connected to each other through the vias 15 interposed therebetween. The transistors TR may be connected through the vias 15 to the wiring pads 13.

A through dielectric pattern TVS may penetrate the contact structure 340 and a pair of first and second stack structures ST1 and ST2. The through dielectric pattern TVS may be disposed on the cell array region CAR adjacent to the pad region CR of the substrate 100. The through dielectric pattern TVS may penetrate the substrate 100, and may contact the peripheral circuit structure PRS. The through dielectric pattern TVS may include a dielectric material (e.g., a silicon oxide layer).

Peripheral contact plugs 450 may be disposed in the through dielectric pattern TVS. The peripheral contact plugs 450 may contact the wiring pads 13 disposed in the peripheral circuit structure PRS, and may be electrically connected to the transistors TR through the wiring pads 13 and the vias 15. The connection lines 430 may be disposed on the peripheral contact plugs 450. The connection lines 430 may extend onto the cell contact plugs 410. The connection lines 430 may electrically connect the peripheral contact plugs 450 to the cell contact plugs 410.

FIGS. 21A to 27A illustrate cross-sectional views taken along line I-I' of FIG. 2, showing a method of fabricating a three-dimensional semiconductor memory device according to some example embodiments of the inventive concepts. FIGS. 21B to 27B illustrate cross-sectional views taken along line II-II' of FIG. 2, showing a method of fabricating a three-dimensional semiconductor memory device according to some example embodiments of the inventive concepts. FIG. 22C illustrates an enlarged view of section D in FIG. 22B.

Figure 21A:
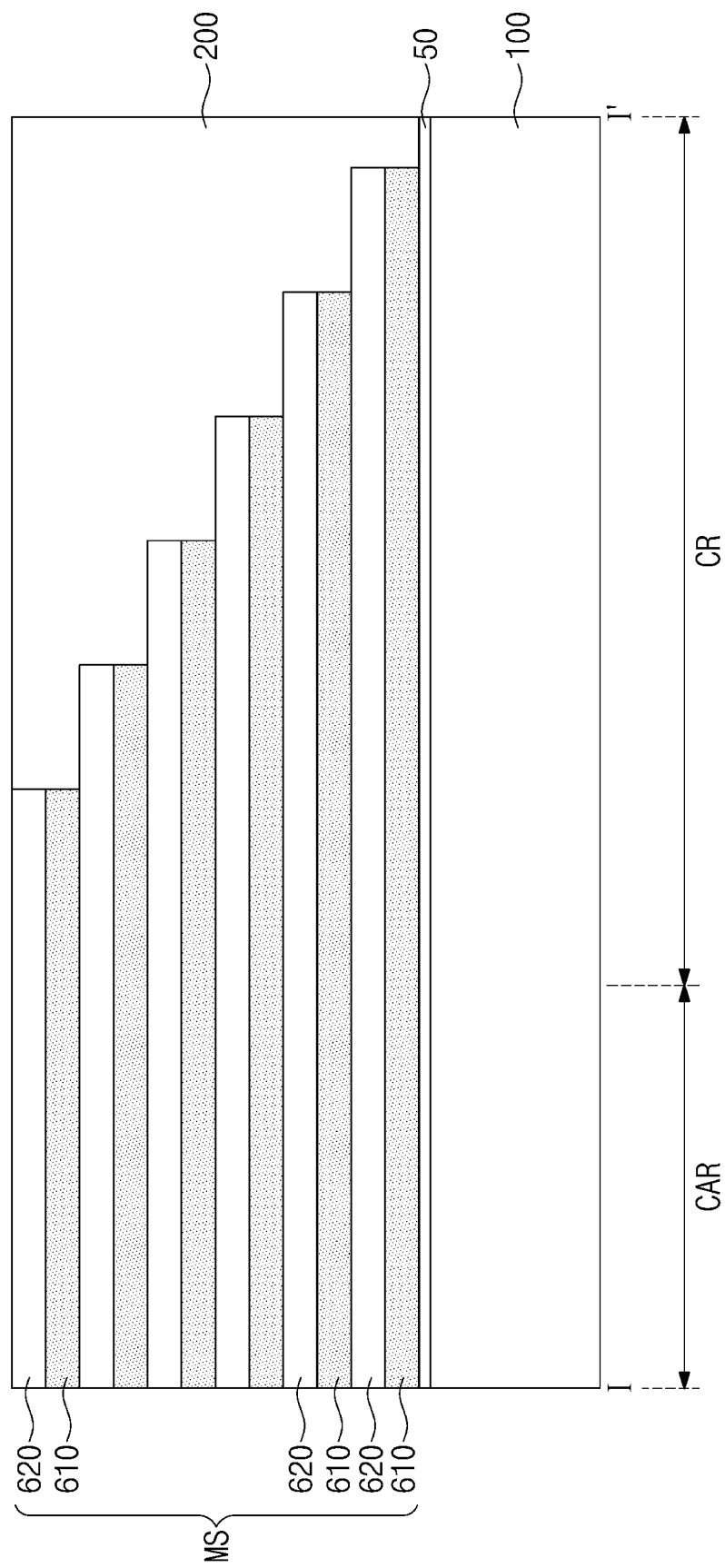
FIGS. 21A, 22A, 23A, 24A, 25A, 26A and 27A illustrate cross-sectional views taken along line I-I' of FIG. 2, showing a method of fabricating a three-dimensional semiconductor memory device according to some example embodiments of the inventive concepts.
Figure 21B:
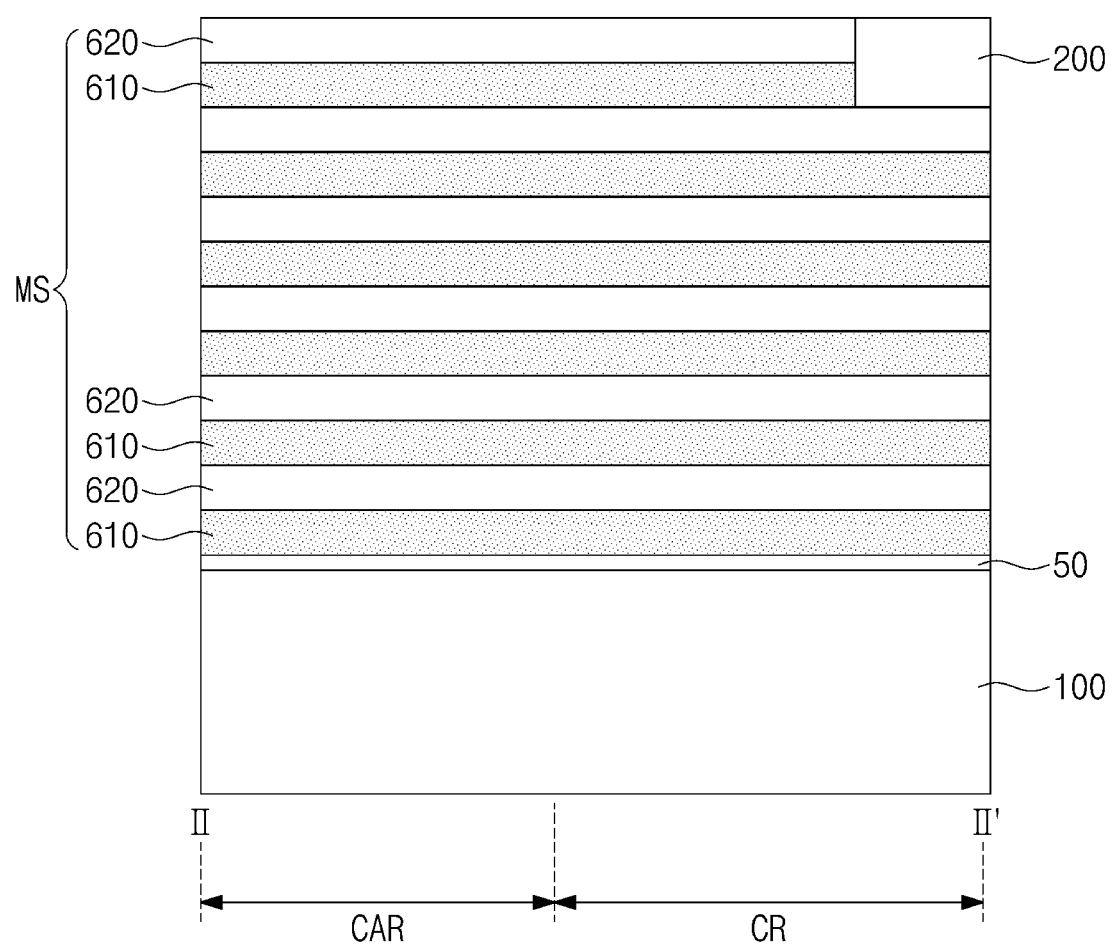
FIGS. 21B, 22B, 23B, 24B, 25B, 26B and 27B illustrate cross-sectional views taken along line II-II' of FIG. 2, showing a method of fabricating a three-dimensional semiconductor memory device according to some example embodiments of the inventive concepts.

Referring to FIGS. 21A and 21B, a substrate 100 may include a cell array region CAR and a pad region CR. A buffer dielectric layer 50 may be formed on the cell array region CAR and the pad region CR of the substrate 100. The buffer dielectric layer 50 may cover a top surface of the substrate 100. A mold structure MS may be formed on the substrate 100. The mold structure MS may be formed by alternately and repeatedly stacking sacrificial layers 610 and dielectric layers 620 on the buffer dielectric layer 50. The sacrificial layers 610 may include, for example, a silicon nitride layer. The dielectric layers 620 may be formed of a material having an etch selectivity with respect to the sacrificial layers 610. The dielectric layers 620 may include, for example, a silicon oxide layer.

The mold structure MS may be patterned to have a stepwise structure on the pad region CR of the substrate 100. The patterning of the mold structure MS may include forming on the mold structure MS a mask pattern (not shown) exposing a portion of the mold structure MS, which portion is formed on the pad region CR of the substrate 100, and then repeatedly performing both a process in which the mask pattern is used as an etching mask to etch the dielectric layers 620 and the sacrificial layers 610 and a process in which a width of the mask pattern is reduced to increase etching-target planar areas of the dielectric layers 620 and the sacrificial layers 610. The mold structure MS may expose the buffer dielectric layer 50 on the pad region CR of the substrate 100. The dielectric layers 620 may have distal ends whose top surfaces are exposed on the pad region CR of the substrate 100. The sacrificial layers 610 may have their lengths in a first direction (see X of FIG. 2) that decrease with increasing distance from the substrate 100, and the dielectric layers 620 may have their lengths in the first direction that decrease with increasing distance from the substrate 100. A pair of the sacrificial layer 610 and the dielectric layer 620 vertically adjacent to each other may have the same length in the first direction X.

An interlayer dielectric pattern 200 may be formed to cover the stepwise structure of the mold structure MS and the buffer dielectric layer 50. The interlayer dielectric pattern 200 may expose a top surface of the mold structure MS. The interlayer dielectric pattern 200 may include, for example, a tetraethylorthosilicate (TEOS) oxide layer.

Figure 22A:
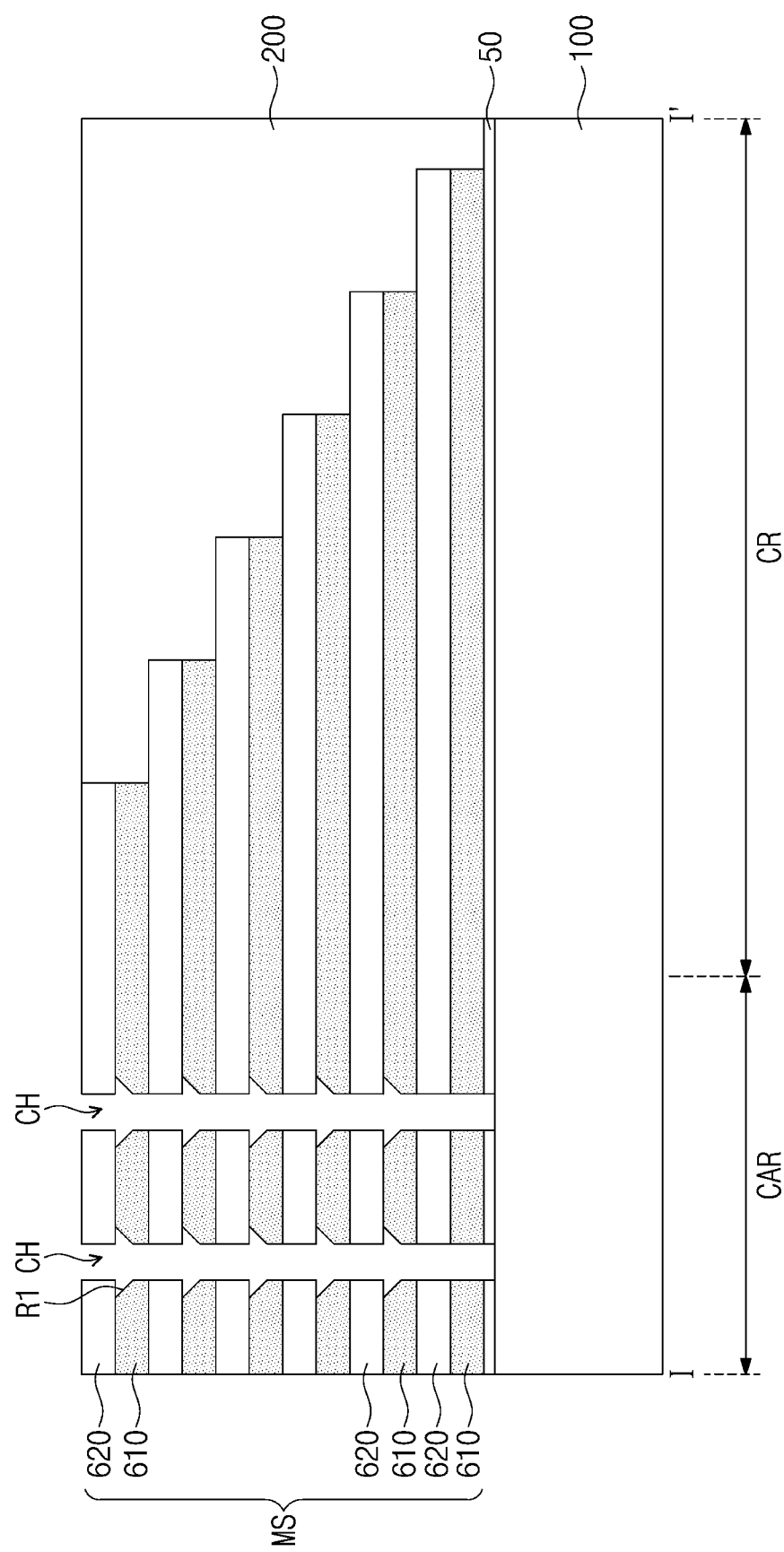
Figure 22B:
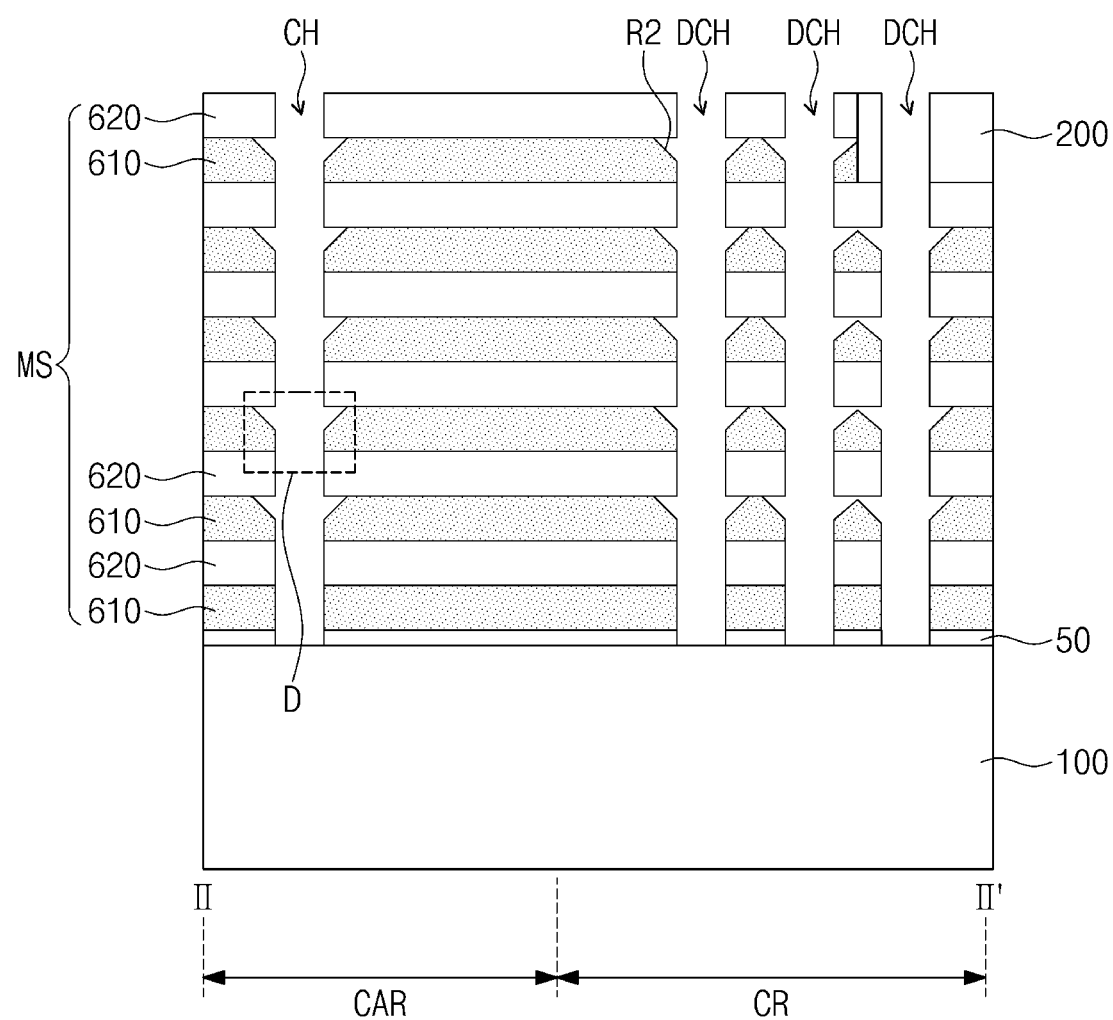

Referring to FIGS. 22A and 22B, the mold structure MS and the buffer dielectric layer 50 may be patterned to form channel holes CH and dummy channel holes DCH in the mold structure MS. The channel holes CH may be formed on the cell array region CAR of the substrate 100, and the dummy channel holes DCH may be formed on the pad region CR of the substrate 100. The formation of the channel holes CH and the dummy channel holes DCH may include forming a mask pattern (not shown) on the mold structure MS and the interlayer dielectric pattern 200, and then using the mask pattern as an etching mask to anisotropically etch the mold structure MS and the interlayer dielectric pattern 200. When viewed in plan, the channel holes CH and the dummy channel holes DCH may have a circular shape, an oval shape, or a polygonal shape.

For example, the number of deposition layers when the dummy channel holes DCH are formed may be greater than the number of deposition layers when the channel holes CH are formed, such that the dummy channel holes DCH may be formed to have their widths and depths greater than those of the channel holes CH. For another example, the dummy channel holes DCH may be formed to have substantially the same width as that of the channel holes CH.

In certain embodiments, an etching process may be performed such that upper sidewalls of the sacrificial layers 610 exposed to the channel holes CH may be recessed from sidewalls of the dielectric layers 620 exposed to the channel holes CH. Therefore, first recess regions R1 may be formed between the sacrificial layers 610 and the dielectric layers 620 adjacent to each other in a third direction (see Z of FIG. 2). In addition, upper sidewalls of the sacrificial layers 610 exposed to the dummy channel holes DCH may be recessed from sidewalls of the dielectric layers 620 exposed to the dummy channel holes DCH. Therefore, second recess regions R2 may be formed between the sacrificial layers 610 and the dielectric layers 620 adjacent to each other in the third direction Z. The first and second recess regions R1 and R2 may partially expose bottom surfaces of the dielectric layers 620. The first recess regions R1 may be spatially connected to corresponding channel holes CH, and the second recess regions R2 may be spatially connected to corresponding dummy channel holes DCH. No etching may occur on lower sidewalls of the sacrificial layers 610 adjacent to top surfaces of the dielectric layers 620. An etching gas may include, for example, one or more of $CH_2F_2$, $C_4F_6$, $C_4F_8$, and $NF_3$.

Figure 22C:
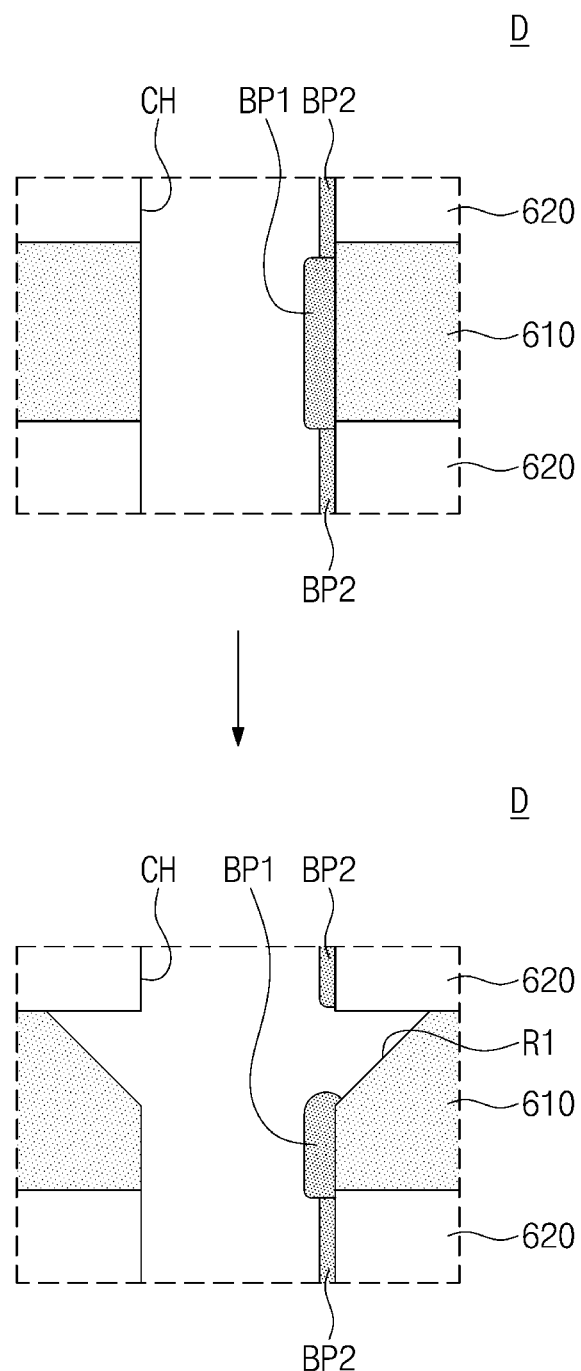
FIG. 22C illustrates an enlarged view of section D in FIG. 22B.

In certain embodiments, as shown in FIG. 22C, during the formation of the channel holes CH and the dummy channel holes DCH, first byproducts BP1 may be formed on sidewalls of the sacrificial layers 610, and second byproducts BP2 may be formed on sidewalls of the dielectric layers 620. The first byproducts BP1 may be layers formed when an etching gas is combined with etched materials detached from the sacrificial layers 610, and the second byproducts BP2 may be layers formed when an etching gas is combined with etched materials detached from the dielectric layers 620. The second byproducts BP2 may be formed thinner than the first byproducts BP1. The first byproducts BP1 may sufficiently cover an interface between each lower portion of the sacrificial layers 610 and each of the dielectric layers 620 below the lower portions of the sacrificial layers 610. Thus, the lower portions of the sacrificial layers 610 may not be etched. In contrast, because the second byproducts BP2 are formed to have small thicknesses on the sidewalls of the dielectric layers 620, etching ions may easily enter an interface between each of the dielectric layers 620 and each of the sacrificial layers 610 below the dielectric layers 620. Accordingly, the first and second recess regions R1 and R2 may be formed between the sacrificial layers 610 and lower portions of the dielectric layers 620. After the etching process, the first and second byproducts BP1 and BP2 may be removed.

In certain embodiments, adhesive forces between top surfaces of the sacrificial layers 610 and bottom surfaces of the dielectric layers 620 may be different from adhesive forces between bottom surfaces of the sacrificial layers 610 and top surfaces of the dielectric layers 620. For example, weak adhesive forces may be provided between the top surfaces of the sacrificial layers 610 and the bottom surfaces of the dielectric layers 620, and strong adhesive forces may be provided between the bottom surfaces of the sacrificial layers 610 and the top surfaces of the dielectric layers 620. Therefore, an etching gas may enter the interfaces between the top surfaces of the sacrificial layers 610 and the bottom surfaces of the dielectric layers 620, thereby etching upper portions of the sacrificial layers 610.

Figure 23A:
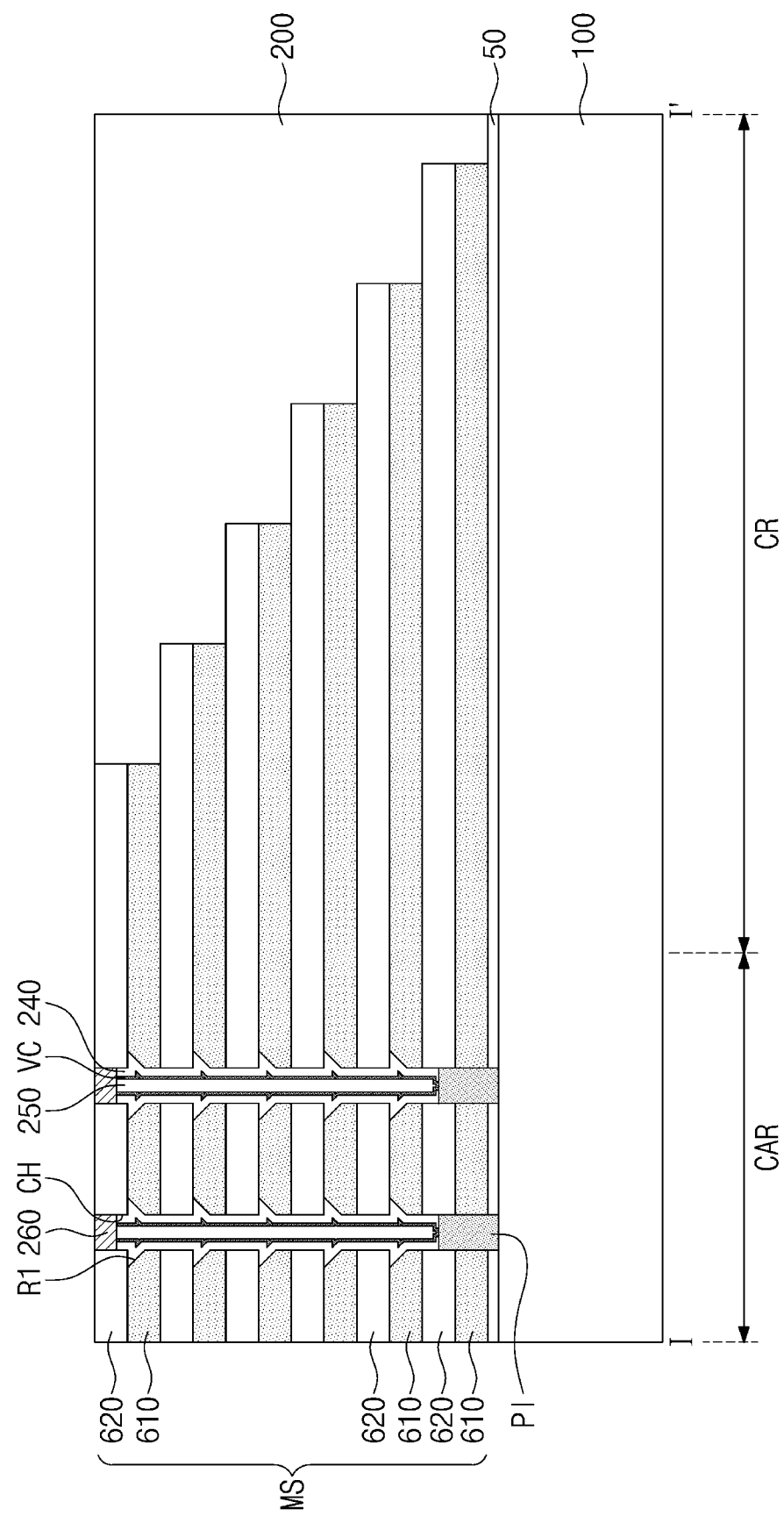
Figure 23B:
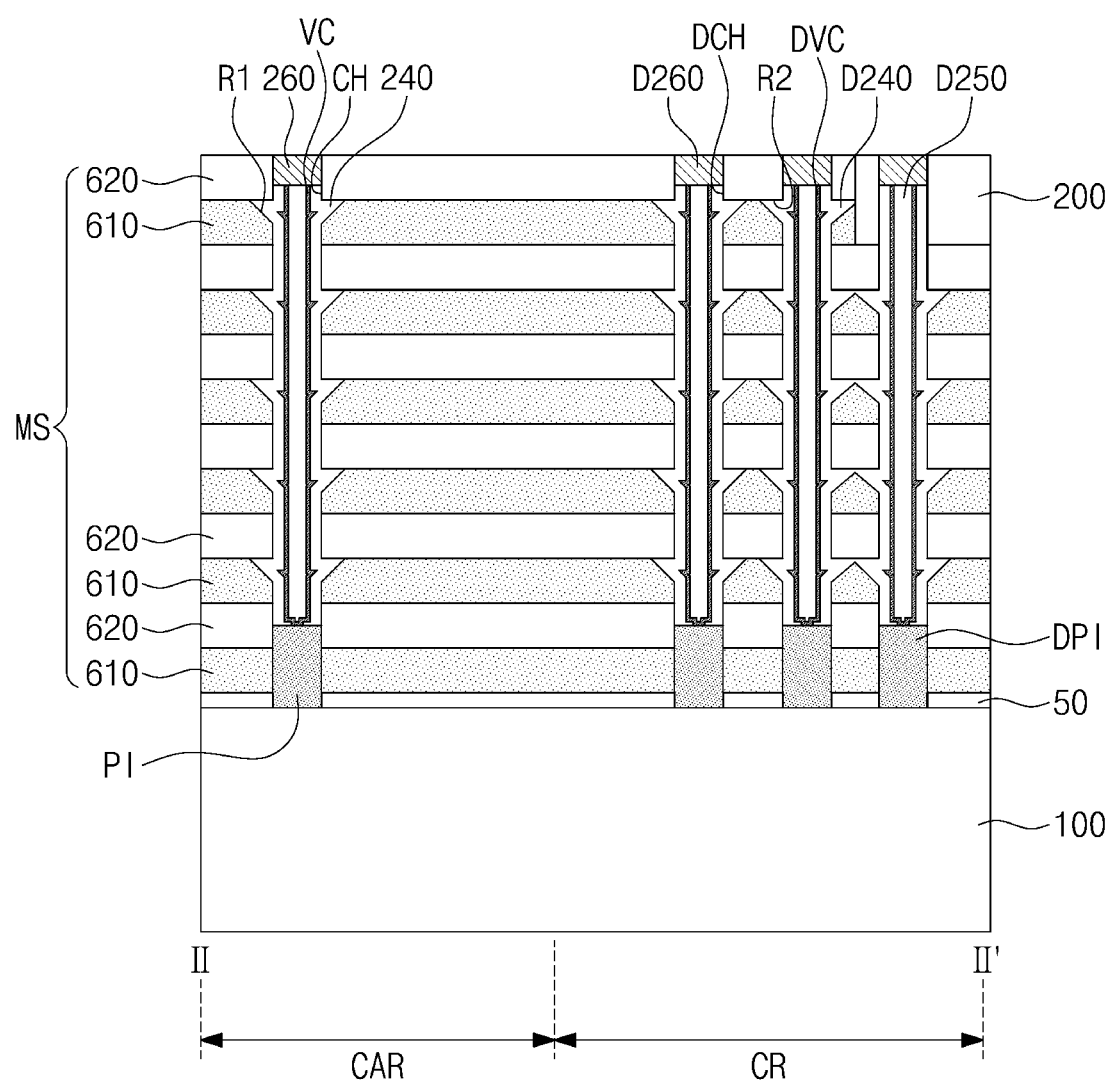

Referring to FIGS. 23A and 23B, semiconductor pillars PI may be formed in the channel holes CH, and dummy semiconductor pillars DPI may be formed in the dummy channel holes DCH. Lower portions of the channel holes CH may be filled with the semiconductor pillars PI, and lower portions of the dummy channel holes DCH may be filled with the dummy semiconductor pillars DPI. A selective epitaxial growth process may be employed to grow the semiconductor pillars PI and the dummy semiconductor pillars DPI from the substrate 100 serving as seeds exposed to the channel holes CH and the dummy channel holes DCH. The semiconductor pillars PI and the dummy semiconductor pillars DPI may include a material whose directionality is the same as that of the substrate 100.

Charge storage structures 240 may be formed in the channel holes CH, and dummy charge storage structures D240 may be formed in the dummy channel holes DCH. The charge storage structures 240 may conformally cover sidewalls of the channel holes CH and sidewalls of the first recess regions R1, and may partially expose top surfaces of the semiconductor pillars PI. The dummy charge storage structures D240 may conformally cover sidewalls of the dummy channel holes DCH and sidewalls of the second recess regions R2, and may partially expose top surfaces of the dummy semiconductor pillars DPI. The first recess regions R1 may be filled with the charge storage structures 240, and the second recess regions R2 may be filled with the dummy charge storage structures D240. Hence, the charge storage structures 240 may include protrusions (see PS of FIG. 5) formed in the first recess regions R1, and the dummy charge storage structures D240 may include dummy protrusions (see DPS of FIG. 6A) formed in the second recess regions R2.

As shown in FIG. 5, each of the charge storage structures 240 may include a blocking dielectric layer BLL, a charge storage layer CTL, and a tunnel dielectric layer TL that are sequentially formed on the sidewall of a corresponding one of the channel holes CH. Similarly, as shown in FIG. 6A, each of the dummy charge storage structures D240 may include a blocking dielectric layer BLL, a charge storage layer CTL, and a tunnel dielectric layer TL that are sequentially formed on the sidewall of a corresponding one of the dummy channel holes DCH. For example, the blocking dielectric layer BLL may include a silicon oxide layer or a high-k dielectric layer (e.g., $Al_2O_3$ or $HfO_2$), the charge storage layer CTL may include a silicon nitride layer, and the tunnel dielectric layer TL may include a silicon oxide layer or a high-k dielectric layer (e.g., $Al_2O_3$ or $HfO_2$).

Vertical channels VC may be conformally formed on the charge storage structures 240, and dummy vertical channels DVC may be conformally formed on the dummy charge storage structures D240. The vertical channels VC may cover the top surfaces of the semiconductor pillars PI exposed by the charge storage structures 240, and the dummy vertical channels DVC may cover the top surfaces of the dummy semiconductor pillars DPI exposed by the dummy charge storage structures D240. The vertical channels VC and the dummy vertical channels DVC may be, for example, one of a polycrystalline silicon layer, an organic semiconductor layer, and carbon nanostructures. The vertical channels VC and the dummy vertical channels DVC may be formed by using, for example, atomic layer deposition (ALD) or chemical vapor deposition (CVD).

The channel holes CH may be filled with gap-fill layers 250, and the dummy channel holes DCH may be filled with dummy gap-fill layers D250. For example, the gap-fill layers 250 may fill inner spaces surrounded by the vertical channels VC, and the dummy gap-fill layers D250 may fill inner spaces surrounded by the dummy vertical channels DVC. An SOG (i.e., silicon-on-glass) technique may be used to form the gap-fill layers 250 and the dummy gap-fill layers D250. The gap-fill layers 250 and the dummy gap-fill layers D250 may include a dielectric material (e.g., a silicon oxide layer). Pads 260 may be formed on upper portions of the vertical channels VC, and dummy pads D260 may be formed on upper portions of the dummy vertical channels DVC. The pads 260 and the dummy pads D260 may be formed by forming recess regions by etching upper portions of the gap-fill layers 250 and by etching upper portions of the dummy gap-fill layers D250, and then filling the recess regions with a conductive material. Alternatively, the pads 260 and the dummy pads D260 may be formed by doping upper portions of the vertical and dummy vertical channels VC and DVC with impurities whose conductive type is different from that of the vertical and dummy vertical channels VC and DVC.

Figure 24A:
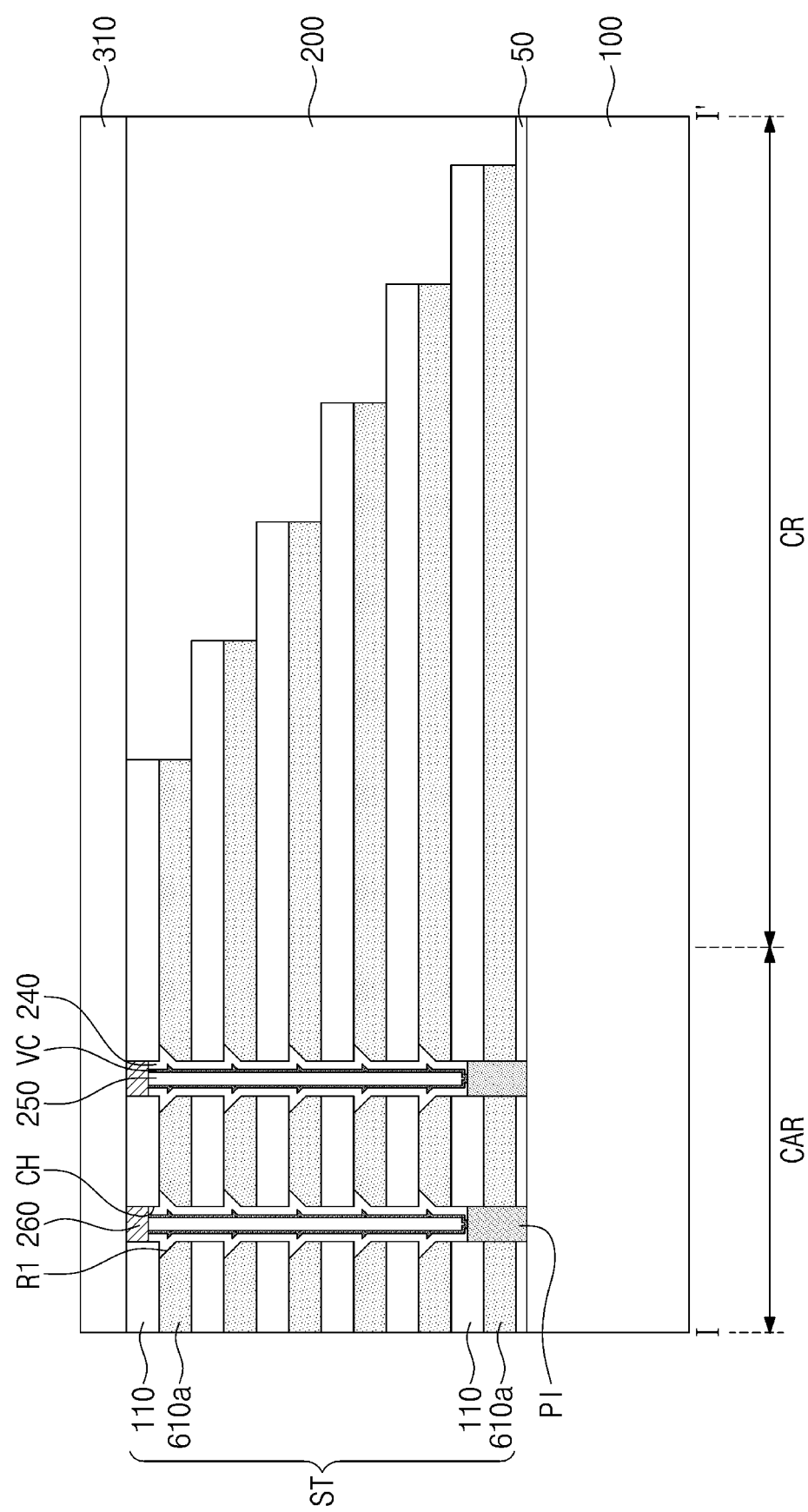
Figure 24B:
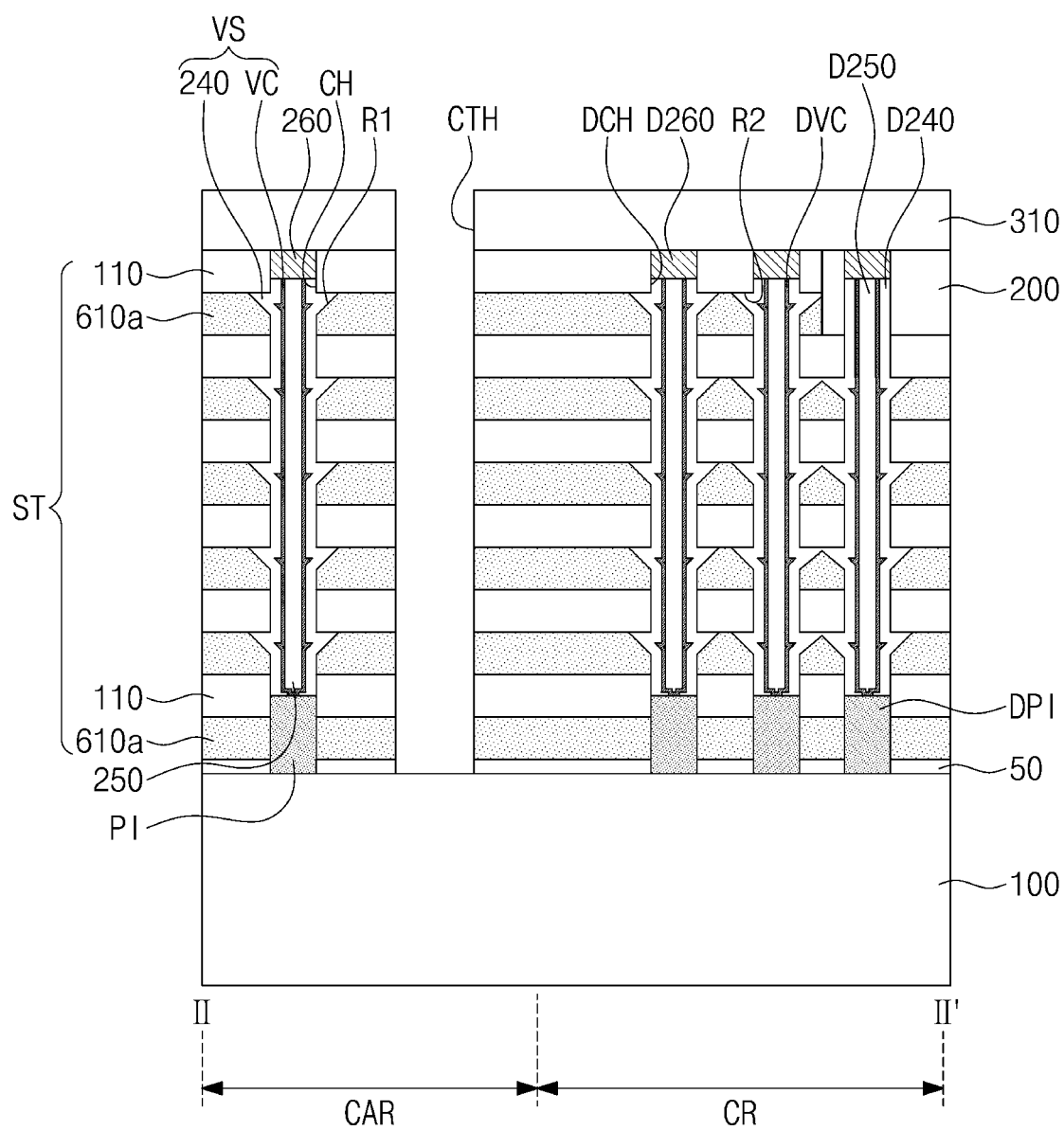

Referring to FIGS. 24A and 24B, the mold structure MS may be anisotropically etched to form a common source trench CTH. The formation of the common source trench CTH may include forming a first interlayer dielectric layer 310 on the mold structure MS, and then using the first interlayer dielectric layer 310 as an etching mask to pattern the mold structure MS and the buffer dielectric layer 50 until the top surface of the substrate 100 is exposed. The common source trench CTH may be formed to extend in the first direction (see X of FIG. 2). The common source trench CTH may then have a linear or rectangular shape extending in the first direction X. The formation of the common source trench CTH may form stack structures ST that are spaced apart from each other in a second direction (see Y of FIG. 2) on the top surface of the substrate 100. Each of the stack structures ST may include sacrificial patterns 610a and dielectric patterns 110. The sacrificial patterns 610a and the dielectric patterns 110 may be alternately and repeatedly stacked on the buffer dielectric layer 50. The stack structures ST may have their sidewalls exposed to the common source trench CTH.

Figure 25A:
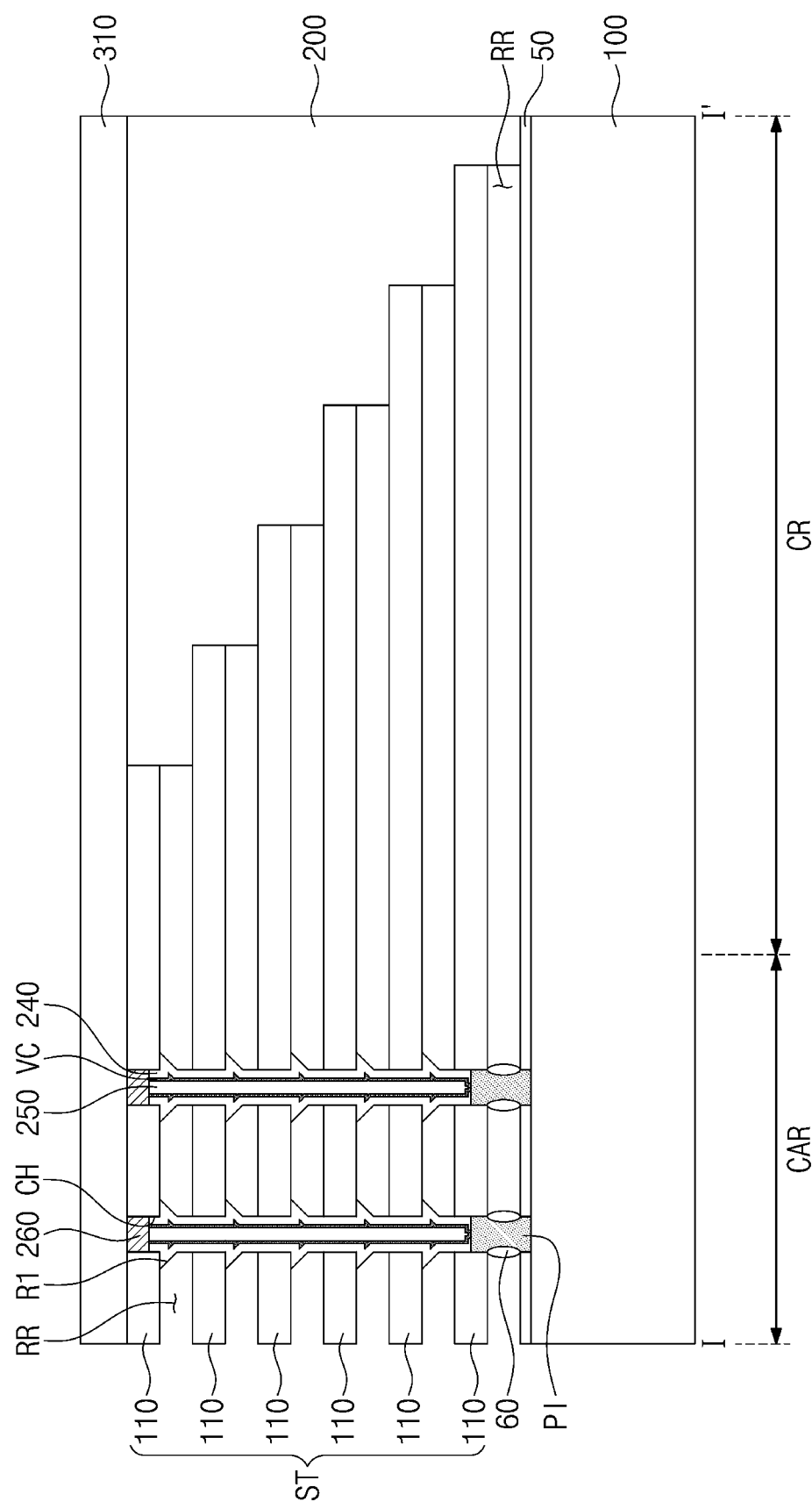
Figure 25B:
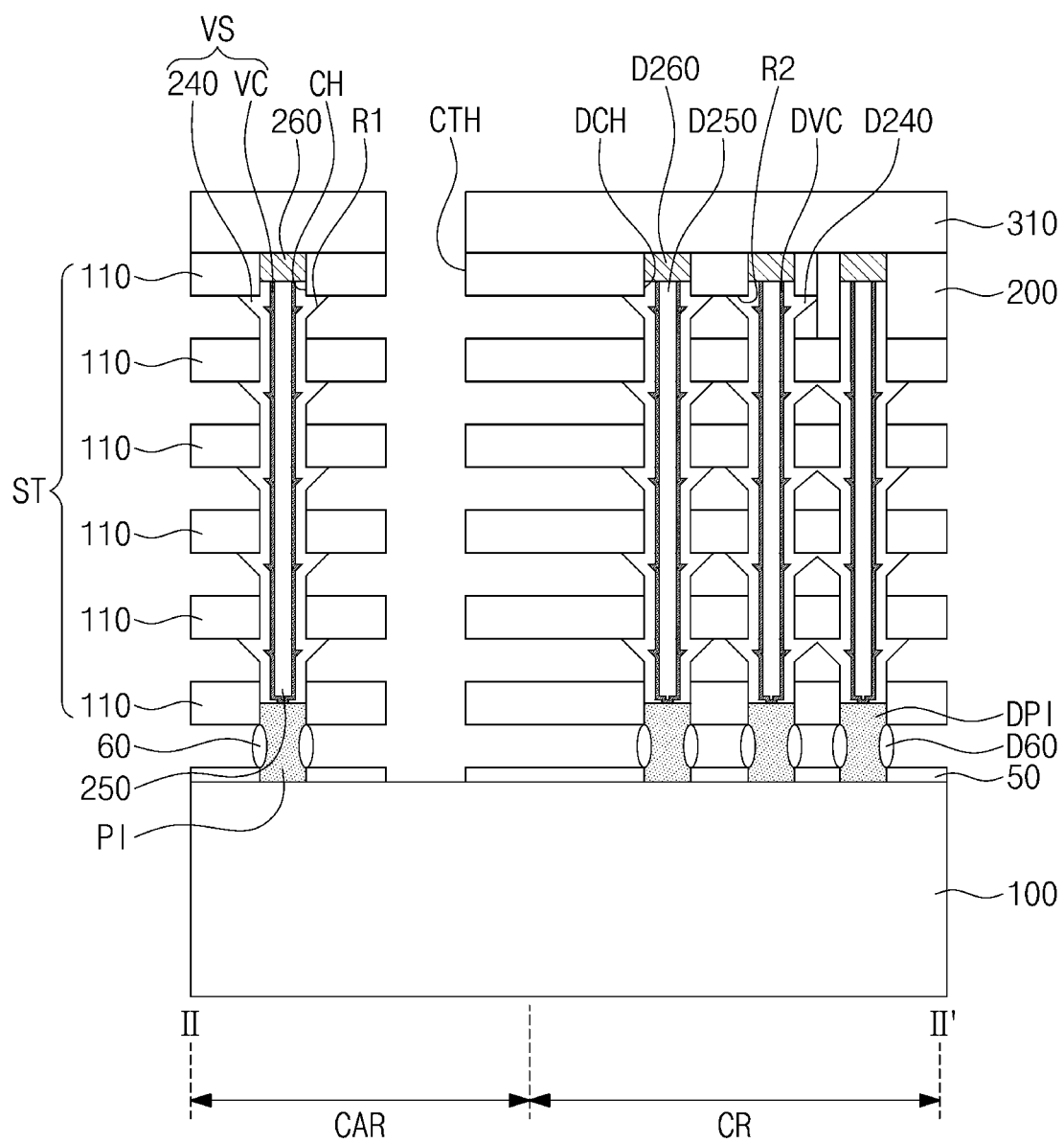

Referring to FIGS. 25A and 25B, the sacrificial patterns 610a exposed to the common source trench CTH may be removed to form recess regions RR. The sacrificial patterns 610a may be removed by performing a wet etching process and/or an isotropic dry etching process. The recess regions RR may be formed between the dielectric patterns 110 vertically adjacent to each other and between the buffer dielectric layer 50 and a lowermost dielectric pattern 110. The etching process may use an etchant including phosphoric acid.

The recess regions RR may horizontally extend from the common source trench CTH into gaps between the dielectric patterns 110. The recess regions RR may expose top and bottom surfaces of the dielectric patterns 110, portions of sidewalls of the charge storage structures 240, portions of sidewalls of the dummy charge storage structures D240, portions of sidewalls of the semiconductor pillars PI, and portions of sidewalls of the dummy semiconductor pillars DPI. The recess regions RR may also expose the protrusions PS of the charge storage structures 240 and the dummy protrusions DPS of the dummy charge storage structures D240.

Gate dielectric layers 60 may be formed on the exposed sidewalls of the semiconductor pillars PI, and dummy gate dielectric layers D60 may be formed on the exposed sidewalls of the dummy semiconductor pillars DPI. The gate dielectric layers 60 and the dummy gate dielectric layers D60 may be formed by performing an oxidation process on the sidewalls of the semiconductor pillars PI and the sidewalls of the dummy semiconductor pillars DPI. The gate dielectric layers 60 and the dummy gate dielectric layers D60 may include, for example, a thermal oxide layer or a silicon oxide layer.

Figure 26A:
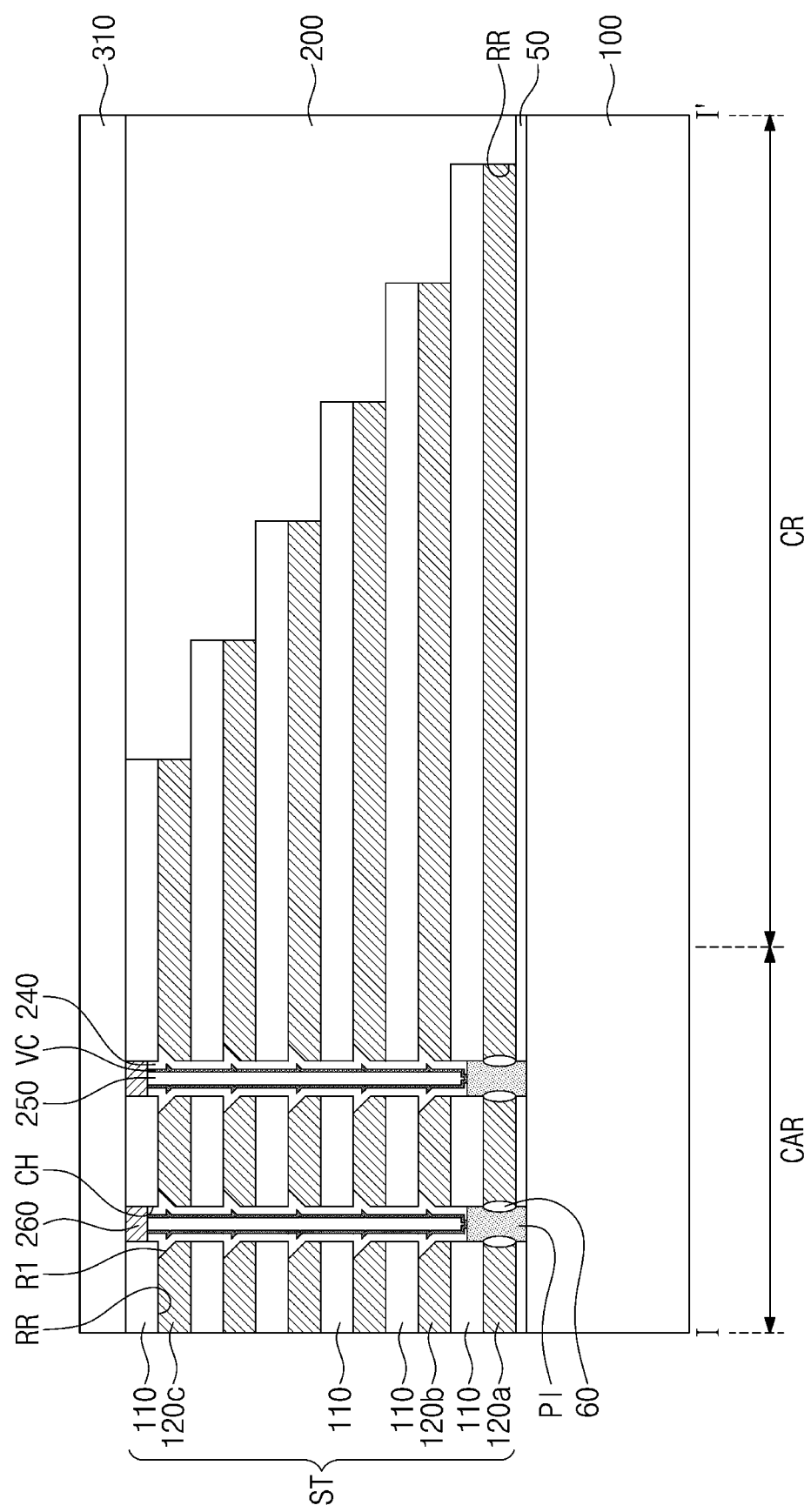
Figure 26B:
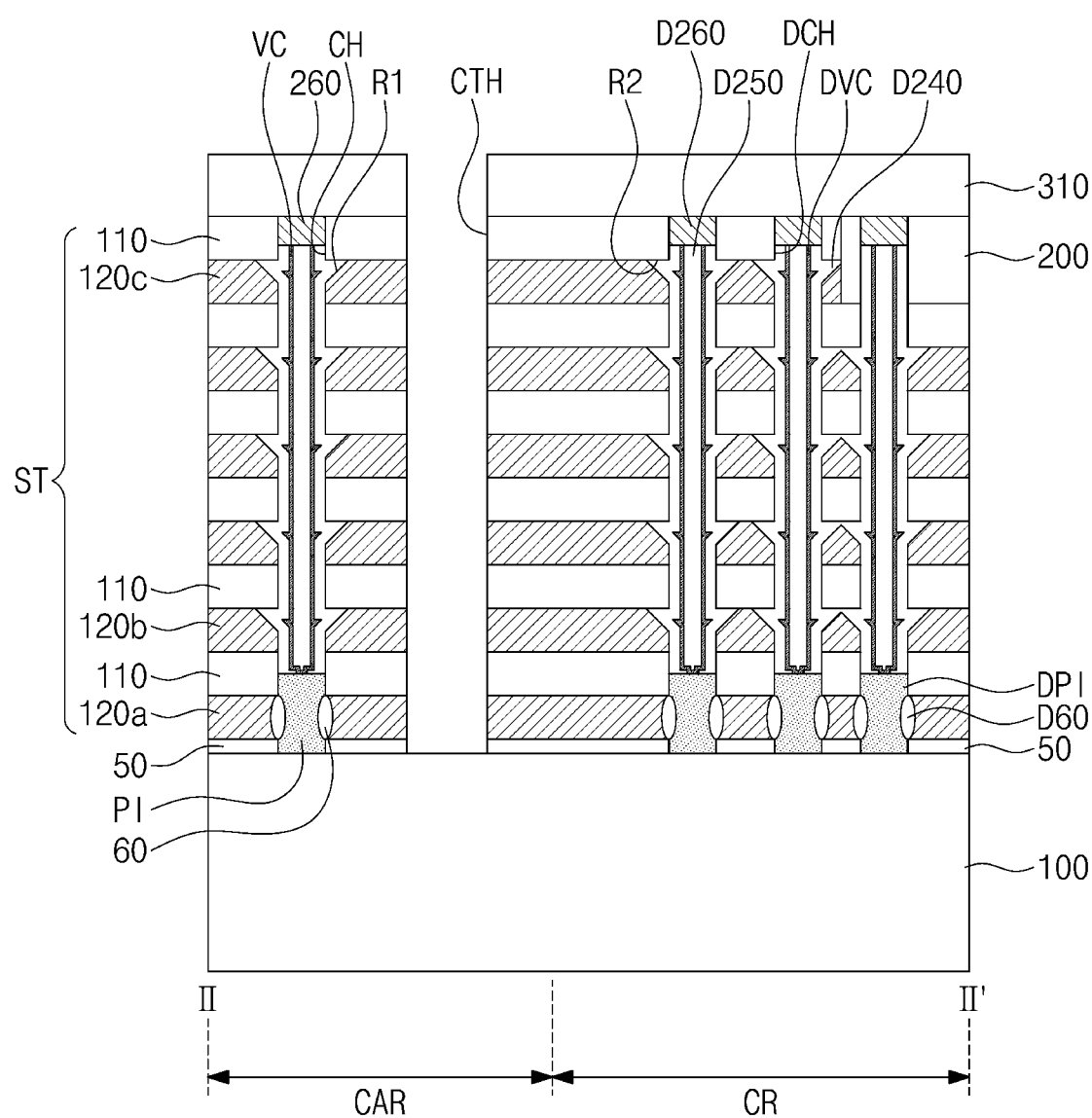

Referring to FIGS. 26A, 26B, and 5, a horizontal dielectric layer 170 (see FIG. 5) may be formed in the recess regions RR. For example, the horizontal dielectric layer 170 may conformally cover surfaces of the dielectric patterns 110, the sidewalls of the charge storage structures 240, the sidewalls of the dummy charge storage structures D240, sidewalls of the gate dielectric layers 60, sidewalls of the dummy gate dielectric layers D60, and a sidewall of the first interlayer dielectric layer 310, which surfaces and sidewalls are exposed to the recess regions RR. The horizontal dielectric layers 170 may be formed by using a deposition process having excellent step coverage. For example, the horizontal dielectric layers 170 may be formed by using chemical vapor deposition (CVD) or atomic layer deposition (ALD).

Gate electrodes 120a, 120b, and 120c may be formed in the recess regions RR. The formation of the gate electrodes 120a, 120b, and 120c may include forming a metal layer to fill the common source trench CTH and the recess regions RR, and then removing the metal layer formed in the common source trench CTH. The gate electrodes 120a, 120b, and 120c may include, for example, doped silicon, metal (e.g., tungsten), metal nitride, metal silicide, or a combination thereof.

Figure 27A:
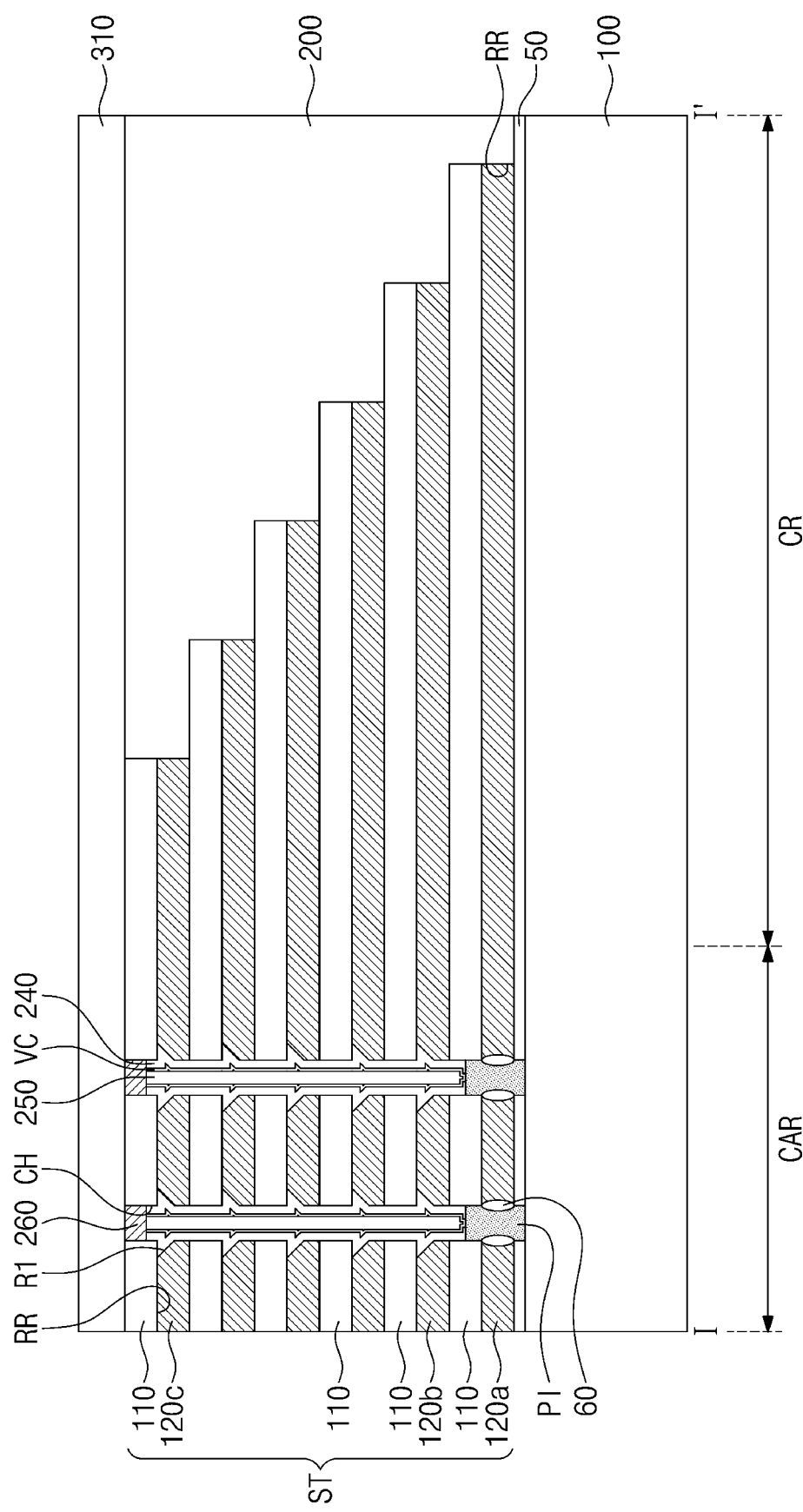
Figure 27B:
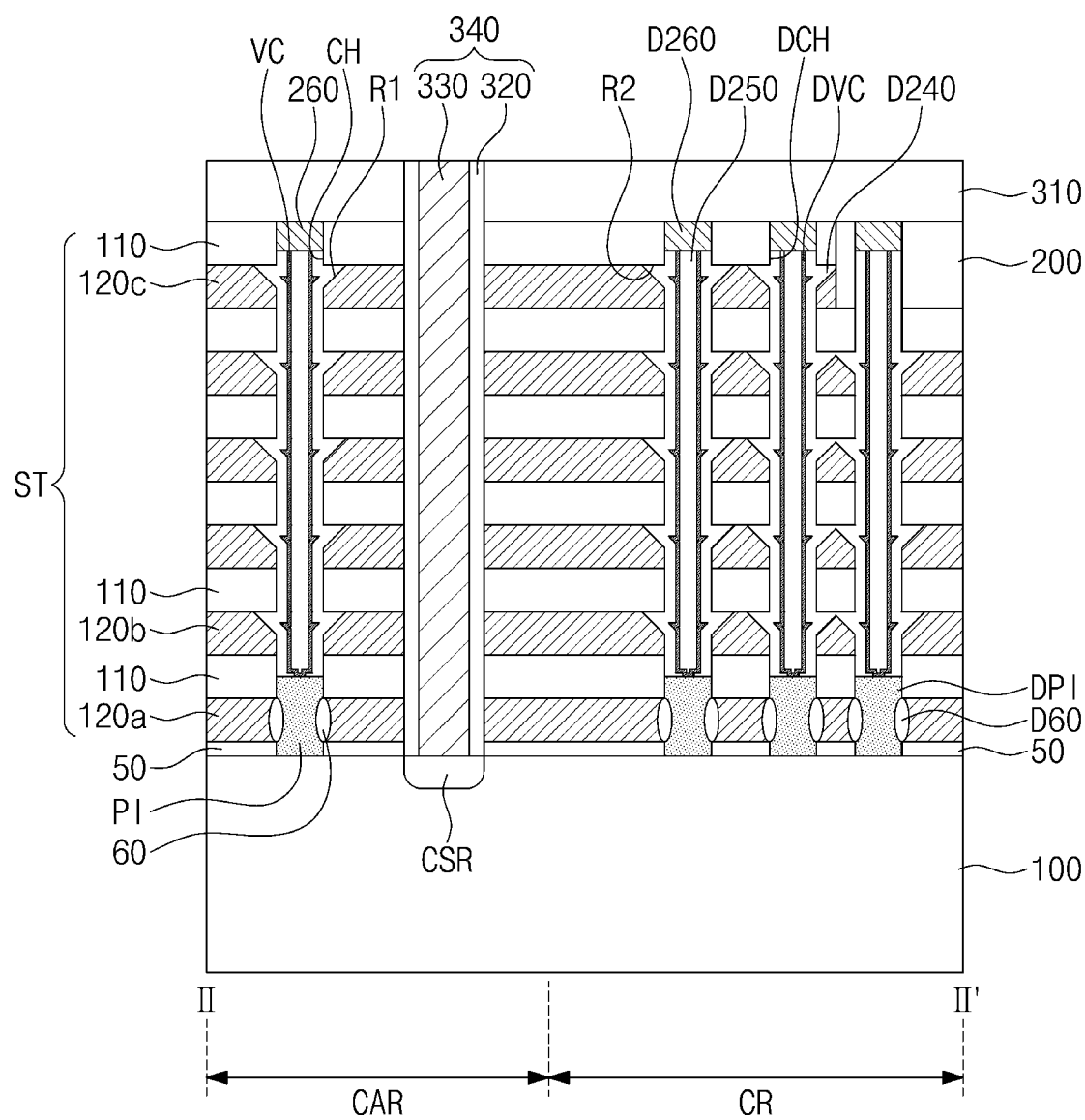

Referring to FIGS. 27A and 27B, a common source region CSR may be formed in the substrate 100 exposed to the common source trench CTH. An ion implantation process may be performed to form the common source region CSR. The common source region CSR may have a conductive type different from that of the substrate 100. A contact structure 340 may be formed in the common source trench CTH. The contact structure 340 may include a spacer 320 and a common source contact 330. The spacer 320 may cover sidewalls of the common source trench CTH. The common source contact 330 may be formed to fill a remaining space of the common source trench CTH in which the spacer 320 is formed.

Referring back to FIGS. 3 and 4, a second interlayer dielectric layer 350 may be formed. The second interlayer dielectric layer 350 may cover the first interlayer dielectric layer 310 and a top surface of the contact structure 340. The second interlayer dielectric layer 350 may include, for example, one or more of a silicon oxide layer, a silicon nitride layer, and a silicon oxynitride layer. Cell contact plugs 410 may be formed on distal ends of the gate electrodes 120a, 120b, and 120c, which distal ends are disposed on the pad region CR of the substrate 100. The cell contact plugs 410 may include one or more of metal (e.g., copper or tungsten) and metal nitride (e.g., TiN, TaN, or WN). Channel contact plugs 420 may be formed on the pads 260. The channel contact plugs 420 may penetrate the first and second interlayer dielectric layers 310 and 350, and may directly contact the pads 260. The channel contact plugs 420 may include one or more of metal (e.g., copper or tungsten) and metal nitride (e.g., TiN, TaN, or WN).

Connection lines 430 may be formed on the second interlayer dielectric layer 350. The connection lines 430 may be connected to the cell contact plugs 410. Bit lines BL may be formed on the second interlayer dielectric layer 350. The bit lines BL may be electrically connected to the vertical channels VC arranged in the second direction (see Y of FIG. 2).

According to some example embodiments of the inventive concepts, it may be possible to provide a three-dimensional semiconductor memory device with improved reliability.

What is claimed is:

1. A three-dimensional semiconductor memory device comprising:
   a stack structure including a plurality of gate structures and first dielectric patterns alternately and repeatedly stacked on a substrate, the gate structures including a plurality of first gate structures, and each of the first gate structures:
      having a top surface and a bottom surface that faces the top surface,
      having a width of the top surface that is different than a width of the bottom surface,
      a first gate part, and
      a second gate part between the first gate part and the first dielectric pattern on the first gate structure, wherein the second gate part includes a region in which a width of the second gate part decreases as approaching the first dielectric pattern;
   a vertical channel penetrating the stack structure on the substrate; and
   a charge storage layer extending from a first location between the vertical channel and the first gate structures to a second location between the vertical channel and the first dielectric patterns, the charge storage layer including first segments between the vertical channel and the first gate structures, and second segments between the vertical channel and the first dielectric patterns, wherein:
   a thickness of the first segments is greater than a thickness of the second segments in a direction parallel to a top surface of the substrate, and
   the width of the top surface or the width of the bottom surface of each first gate part is the same as a width of a first dielectric pattern, among the first dielectric patterns, on the top surface of the first gate structure.

2. The three-dimensional semiconductor memory device of claim 1, wherein:
   the width of the top surface of each first gate structure is less than the width of the bottom surface of the first gate structure, and
   the width of the top surface of each first gate structure is less than a width of a top surface of the first dielectric pattern on the first gate structure.

3. The three-dimensional semiconductor memory device of claim 1, wherein:
   the gate structures further include a second gate structure,
   the first gate structures and the second gate structure constitute a single cell string,
   the first gate structures are cell gate structures of the single cell string, and
   the second gate structure is a string select gate structure of the single cell string.

4. The three-dimensional semiconductor memory device of claim 1, wherein:
   each first gate structure includes a first gate part and a second gate part between the first gate part and the first dielectric pattern on the first gate structure,
   at each first gate structure the charge storage layer has a depression which is recessed from a sidewall of the charge storage layer, and
   the depression is disposed at a same height above a top surface of the substrate as the second gate part.

5. The three-dimensional semiconductor memory device of claim 1, further comprising:
   a tunnel dielectric layer between the charge storage layer and the vertical channel; and
   a blocking dielectric layer between the charge storage layer and the first gate structures, wherein:
   at each first gate structure, the blocking dielectric layer has a first cavity which is depressed from a sidewall of the blocking dielectric layer,
   the charge storage layer has a second cavity which is depressed from a sidewall of the charge storage layer,
   the charge storage layer is in the first cavity, and
   the tunnel dielectric layer is in the second cavity.

6. The three-dimensional semiconductor memory device of claim 5, further comprising a capping pattern between the vertical channel and the tunnel dielectric layer at each first gate structure, the capping pattern being in the second cavity.

7. The three-dimensional semiconductor memory device of claim 1, wherein:
   the substrate includes a cell array region and a pad region,
   the stack structure extends onto the pad region from the cell array region, and
   the three-dimensional semiconductor memory device further comprises a first dummy vertical structure and a second dummy vertical structure which penetrate the stack structure on the pad region of the substrate, the first dummy vertical structure has first protrusions which protrude from a sidewall of the first dummy vertical structure, the second dummy vertical structure has second protrusions which protrude from a sidewall of the second dummy vertical structure, and the first protrusions of the first dummy vertical structure and the second protrusions of the second dummy vertical structure are in contact with the first gate structures.

8. The three-dimensional semiconductor memory device of claim 7, wherein the first protrusions of the first dummy vertical structure are in contact with the second protrusions of the second dummy vertical structure.

9. The three-dimensional semiconductor memory device of claim 7, further comprising:

respective air gaps between the first protrusions of the first dummy vertical structure and the second protrusions of the second dummy vertical structure, wherein the air gaps are interposed between the first dielectric patterns and the first gate structures.

10. The three-dimensional semiconductor memory device of claim 1, wherein the first gate structures are adjacent to each other in a direction perpendicular to a top surface of the substrate.

11. The three-dimensional semiconductor memory device of claim 1, wherein:

the charge storage layer surrounds the vertical channel, the gate structures surround the charge storage layer, and a shape of the first gate structures is the same at opposite sides of the vertical channel.

12. A three-dimensional semiconductor memory device comprising:

a stack structure including a plurality of gate structures and first dielectric patterns alternately and repeatedly stacked on a substrate, the gate structures including a plurality of first gate structures each having a top surface and a bottom surface that faces the top surface and a width of the top surface that is different than a width of the bottom surface;

a vertical channel penetrating the stack structure on the substrate; and a charge storage structure extending from a first location between the vertical channel and the first gate structures to a second location between the vertical channel and the first dielectric patterns, the charge storage structure including first charge storage segments between the vertical channel and the first gate structures and second charge storage segments between the vertical channel and the first dielectric patterns, wherein:

a thickness of the first charge storage segment is greater than a thickness of the second charge storage segment, the width of the top surface or the width of the bottom surface of each first gate structure is the same as a width of a first dielectric pattern on the top surface of the first gate structure, and the width of the bottom surface of each first gate structure is less than the width of the top surface of the first gate structure, and the width of the bottom surface of each first gate structure is less than a width of a bottom surface of the first dielectric pattern on the first gate structure.

13. The three-dimensional semiconductor memory device of claim 12, wherein the charge storage structure covers horizontal surfaces of the first dielectric patterns, the horizontal surfaces being exposed to areas where the first dielectric patterns are spaced apart from the first gate structures.

14. The three-dimensional semiconductor memory device of claim 12, wherein:

the width of the top surface of each first gate structure is less than the width of the bottom surface of the first gate structure, and the width of the top surface of each first gate structure is less than a width of a top surface of the first dielectric pattern on the first gate structure.

15. The three-dimensional semiconductor memory device of claim 12, wherein:

each first gate structure includes a first part and a second part between the first part and the first dielectric pattern on the first gate structure, at each first gate structure, the charge storage structure has a depression which is recessed from a sidewall of the charge storage structure, and the depression is disposed at a same height above a top surface of the substrate as the second part.

16. A three-dimensional semiconductor memory device comprising:

a stack structure including a plurality of gate structures and dielectric patterns alternately and repeatedly stacked on a substrate, the gate structures including a plurality of first gate structures each having a top surface and a bottom surface that faces the top surface and a width of the top surface that is different than a width of the bottom surface, the dielectric patterns including first dielectric patterns adjacent to the first gate structures; and a vertical channel structure penetrating the stack structure, the vertical channel structure extending onto first sidewalls of the first gate structures and onto first sidewalls of the first dielectric patterns, wherein:

the vertical channel structure has protrusions which protrude from a sidewall of the vertical channel structure, the first sidewalls of each of the first gate structures include first recess regions, the protrusions are in the first recess regions, and one of the width of the top surface and the bottom surface of each first gate structure from among the first gate structures is the same as a width of a first dielectric pattern from among the first dielectric patterns on the first gate structure.

17. The three-dimensional semiconductor memory device of claim 16, wherein:

the protrusions cover horizontal surfaces of the first dielectric patterns, the horizontal surfaces being exposed to areas where the first dielectric patterns are spaced apart from the first gate structures, and the horizontal surfaces have an obtuse angle with respect to the first sidewalls of the first dielectric patterns.

18. The three-dimensional semiconductor memory device of claim 16, wherein:

the substrate includes a cell array region and a pad region, the vertical channel structure is on the cell array region of the substrate, the three-dimensional semiconductor memory device further comprises a dummy vertical channel structure penetrating the stack structure on the pad region of the substrate, the dummy vertical channel structure extends onto second sidewalls of the first gate structures and onto second sidewalls of the first dielectric patterns, each of the second sidewalls of the first gate structures includes second recess regions, the dummy vertical channel structure has dummy protrusion which protrudes from a sidewall of the dummy vertical channel structure, and the dummy protrusions are in the second recess regions.

\* \* \* \* \*